United States Patent
Shimizu et al.

(10) Patent No.: US 6,313,476 B1
(45) Date of Patent: Nov. 6, 2001

(54) CHARGED BEAM LITHOGRAPHY SYSTEM

(75) Inventors: Mitsuko Shimizu, Machida; Takayuki Abe, Kawasaki; Hirohito Anze, Kawasaki; Susumu Oogi, Kawasaki; Takashi Kamikubo, Kawasaki; Eiji Murakami, Kawasaki; Yoshiaki Hattori; Tomohiro Iijima, both of Numazu; Hitoshi Higurashi, Yokohama; Kazuto Matsuki, Tokyo-To, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/459,648

(22) Filed: Dec. 13, 1999

(30) Foreign Application Priority Data

Dec. 14, 1998 (JP) .................................................. 10-375311

(51) Int. Cl.[7] .............................. A61N 5/00; G21G 5/00; G21K 5/10; H01J 37/08
(52) U.S. Cl. ........................................................ 250/492.22
(58) Field of Search .................................. 430/5, 296, 30; 250/492.22, 492.2, 492

(56) References Cited

U.S. PATENT DOCUMENTS 4,213,053 * 7/1980 Pfeiffer ................................. 250/492
4,698,509 * 10/1987 Wells et al. ........................ 250/492.2

(List continued on next page.)

FOREIGN PATENT DOCUMENTS

269128 * 9/2000 (JP) .............................. H01L/21/027

OTHER PUBLICATIONS

M. Parikh, J. Appl. Phys., vol. 50, No. 6, pp. 4371 to 4387, "Corrections to Proximity Effects in Electron Beam Lithography", Jun. 1979.
T. Abe, et al., Journal of Vacuum Science & Technology B, vol. 7, No. 6, pp. 1524 to 1527, "Proximity Effect Correction for an Electron Beam Direct Writing System", Nov./Dec. 1989.

Primary Examiner—Jack Berman
Assistant Examiner—Johnnie Smith, II
(74) Attorney, Agent, or Firm—Oblon, Spivak, McClelland, Maier & Neustadt, P.C.

(57) ABSTRACT

A charged beam lithography system includes a charged particle gun for generating charged beams, a main deflecting system and a sub-deflecting system for deflecting the charged beams generated by the charged particle gun, and a control computer. The charged beam lithography system is designed to cause the surface of a substrate to be irradiated with the charged beams from the charged particle gun while continuously moving a stage, to write a desired pattern for each of stripes defined by the maximum deflection widths of the main deflecting system and the sub-deflecting system. The charged beam lithography system further comprises: a real time proximity effect correcting circuit for calculating an optimum dosage for each of the stripes by correcting the dosage of the electron beams in view of the influence of the proximity effect; and a cash memory for storing the optimum dosage data for at least two of the stripes. Thus, the charged beam lithography system is designed to shift a divided form of the whole written region using the stripes at each wiring number of times, by a predetermined distance from a predetermined reference position in a direction perpendicular to a stage continuous moving direction, while selectively extracting the optimum dosage data from the cash memory so as to correspond to each of written stripes at each writing number of times, to write patterns. During the writing operation, the optimum dosage data corresponding to the next region to be written are transferred from the real time proximity effect correcting circuit to the cash memory, and the real time proximity effect correcting circuit calculates optimum dosages for the stripes corresponding to regions to be written after next and thereafter.

12 Claims, 39 Drawing Sheets

U.S. PATENT DOCUMENTS

| | | |
|---|---|---|
| 5,305,225 | 4/1994 | Yamaguchi et al. . |
| 5,725,974 * | 3/1998 | Kawahira .................................. 430/5 |
| 5,760,410 * | 6/1998 | Matsuki et al. ................. 250/492.22 |
| 5,863,682 | 1/1999 | Abe et al. . |
| 5,885,747 * | 3/1999 | Yamasaki et al. .................... 430/296 |
| 5,894,057 | 4/1999 | Yamaguchi et al. . |
| 5,989,764 * | 11/1999 | Adams .................................... 430/30 |
| 6,153,340 * | 11/2000 | Nakasuji .................................. 430/5 |

\* cited by examiner

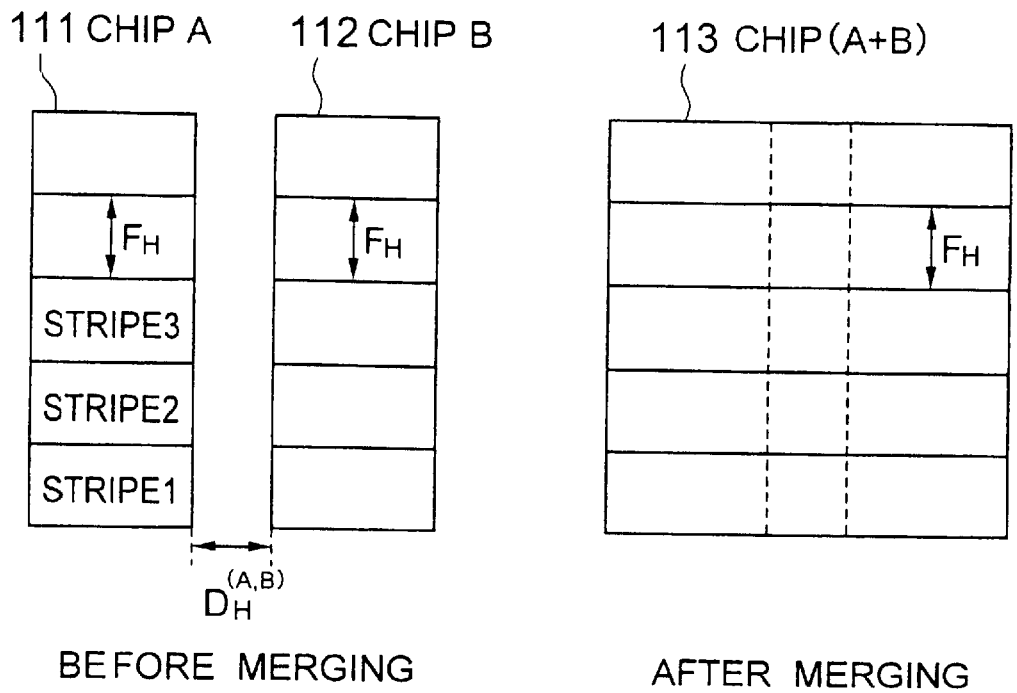
BEFORE MERGING
FIG. 10A
AFTER MERGING
FIG. 10C
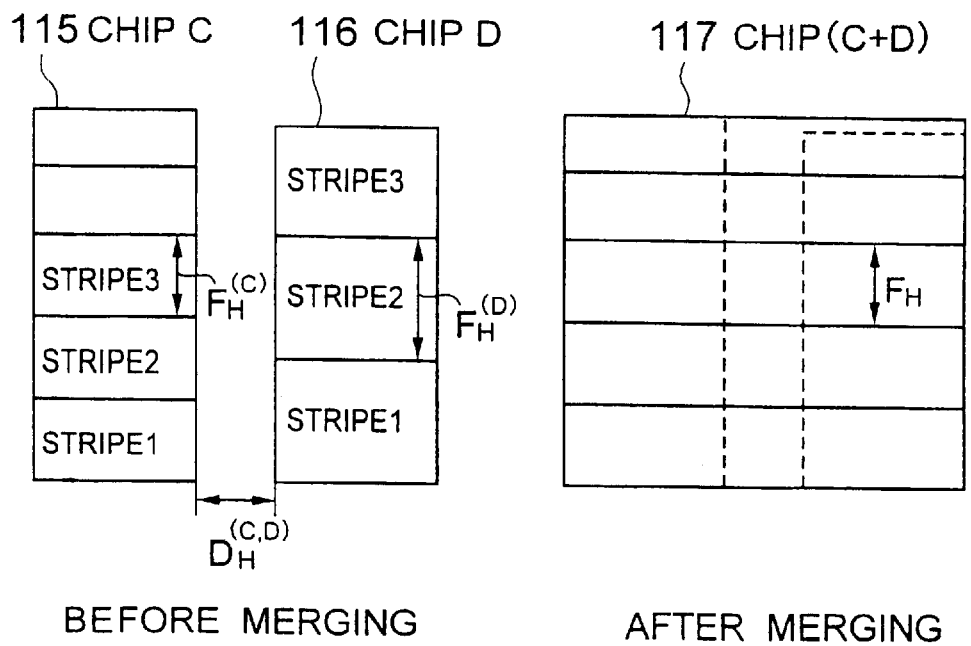
BEFORE MERGING
FIG. 10B
AFTER MERGING
FIG. 10D

BEFORE MERGING

AFTER MERGING

BEFORE MERGING

AFTER MERGING

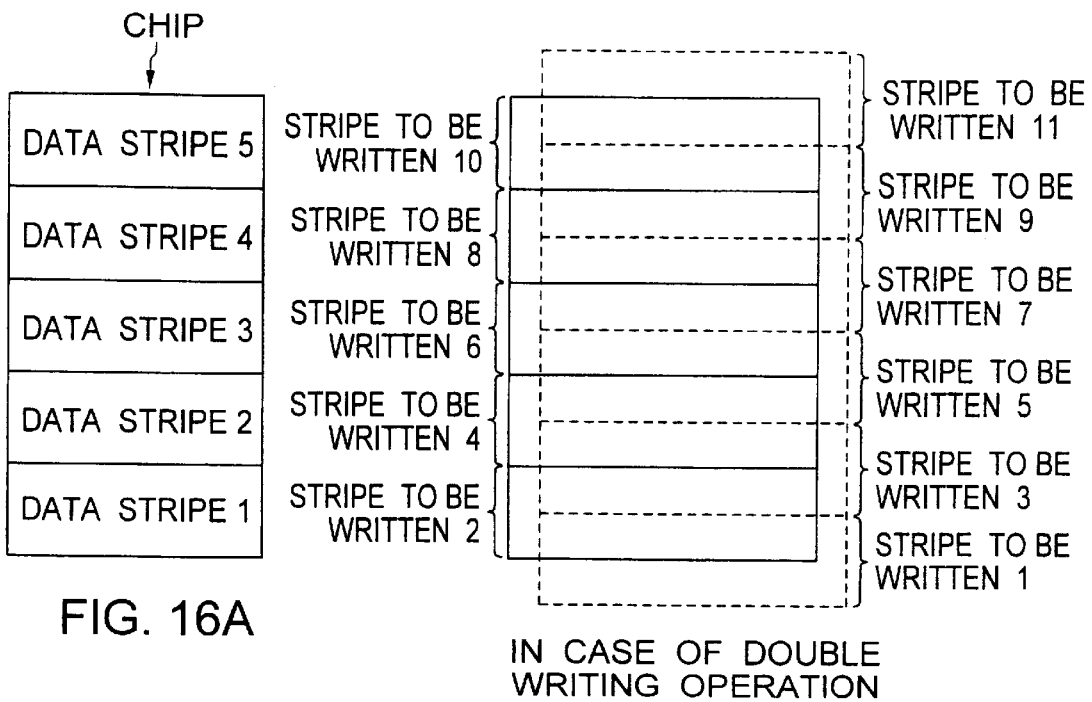
FIG. 16A
FIG. 16B
IN CASE OF DOUBLE WRITING OPERATION
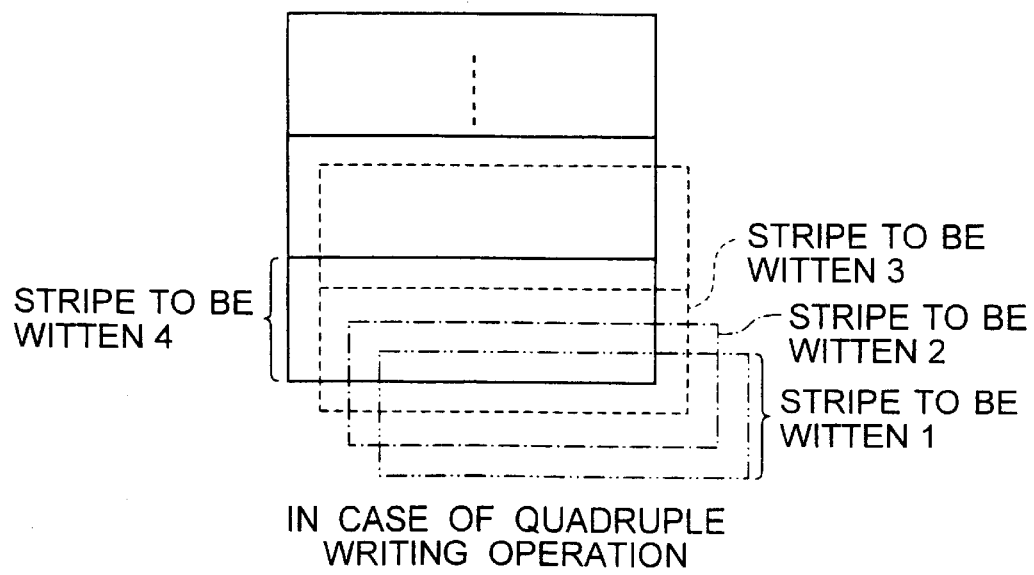
FIG. 16C
IN CASE OF QUADRUPLE WRITING OPERATION

| DOSAGE DATA AT THE COORDINATES (x,y) OF MESH BOUNDARY |
|---|
| · |
| · |
| · |

CHARGED BEAM LITHOGRAPHY SYSTEM

BACKGROUND OF THE INVENTION

1. Field of the Invention

The present invention relates generally to a charged beam lithography system. More specifically, the invention relates to a charged beam lithography system capable of rapidly and precisely correcting the proximity effect caused under the influence of backward scattered electrons produced by the irradiation with charged beams, such as an electron beam or an ion beam.

2. Description of the Prior Art

With the higher density integration of semiconductor devices, a charged beam lithography system for writing a pattern on a substrate, such as a wafer or a reticle, using charged beams, such as an electron beam or an ion beam has been developed.

Since a typical semiconductor device is designed by means of a computer aided design (CAD), writing data for a charged beam lithography system are also prepared using CAD data.

However, since the writing data have a characteristic data format, there is a problem in that it takes very much time to convert the CAD data.

In addition, in the pattern lithography using charged beams, there is a problem in that the charged beam exposures of adjacent patterns is increased by scattered electrons (backward scattered electrons, forward scattered electrons) produced from a substrate irradiated with charged beams such as EB(Electron Beam). For example, as shown in the schematic diagram of FIG. 1, if a certain point P is irradiated with an electron beam 311 in order to write a pattern on a substrate 310, scattered electrons (backward scattered electrons) are produced from the substrate 310 by irradiation energy supplied onto the point P. Since the amount of backward scattered electrons thus produced is maximum at the point P and decreases with the increase of the distance from the point P, energy 312 of the backward scattered electrons is distributed as if contour lines of concentric circles about the point P are drawn. For example, in the case of an electron beam lithography system having an acceleration voltage of 50 kV, electrons scattered backward have an influence on a range of about 10 to 20 $\mu$m (back-scattering range $\sigma_b$) from the incident point P. Therefore, even if the same dosage is applied, the actual EB exposure to adjacent patterns is different from that to isolated patterns. This is a phenomenon called the proximity effect. Under the influence of the proximity effect, the shape of a desired pattern deteriorates, and the dimension thereof varies. Therefore, with the scale down of patterns, it is an important problem to correct the EB exposure to suppress the influence of the proximity effect. Conventionally, in order to solve this problem, an auxiliary region having a size based on a back scattering range $\sigma_b$ was provided around a pattern to be written and the optimum correcting dosage has been corrected by means of a data processing with a software or by means of a hardware in an electron beam lithography system taking account of the influence of the backward scattering from the auxiliary region.

However, if the proximity effect correction is carried out by means of a software when a pattern is written on a reticle, it takes a lot of time to make a calculation since there are mass data to carry out a correction processing. Therefore, in order to shorten the processing time required for the correction processing, a high-speed computer outside the electron beam lithography system is utilized, and a parallel processing is utilized, similar to a case where patterns are written directly on a wafer.

As one of methods for solving the above-described problem by means of hardware, there is a method for providing a real time proximity effect correcting circuit in an electron beam lithography system. As the form of a real time proximity effect correcting circuit, there is a first example of a method in which correction of data of all patterns on a reticle are batch-processed and the patterns thereon are written using the corrected data. However, since this method can not write patterns unless the correction in the whole area of the reticle is completed, the total throughput of the electron beam lithography system is small. There is also a second example of a method for dividing writing data into stripes to use each of the stripes as a writing unit to carry out the correction and writing every stripe by the pipeline processing. According to this method, the loss time of the electron beam lithography system is far less than that in the first example. Furthermore, in these examples, the optimum dosage data are set every region of about several $\mu$m.

In a case where a plurality of patterns for semiconductor chips are written on the same substrate, there are some cases where the chips are arranged at shorter intervals than the backward scattering range $\sigma_b$. Conventionally, since the proximity effect correction is carried out in each of the chips, the proximity effect has an influence on the patterns in the end portion of each of the chips, so that it is not possible to obtain a target precision in that portion. In order to avoid such a situation, a method for integrating (merging) a plurality of chips into one chip at the stage of the CAD data is considered. However, in order to cause the proximity effect correction to be reflected in the whole chip, the conversion of the CAD data into the writing data must be carried out again, so that it takes very much time to carry out the processing.

In addition, there are some cases in that patterns to be written include a pattern (which will be hereinafter referred to as a "protruding pattern") which is to be divided by the boundary line between adjacent two stripes formed by dividing the whole region to be written. There may be some cases in which, if a protruding part locates outside a certain stripe by a predetermined range, such protruding pattern is written together with the stripe. For example, in the above described first example, the calculation for correction is carried out on the whole surface, so that there is no problem since the inside and outside of the stripes are distinguished from each other. However, the performance of the whole system remains being low. On the other hand, in the second example for carrying out the calculation for correction every stripe, there is a problem. That is, since the auxiliary region for calculating the proximity effect correction is not defined with respect to a portion protruding from a certain stripe, it is not possible to precisely calculate the corrected dosage. For that reason, the corrected dosage is outputted with respect to only patterns contained in the same region as the stripe region, so that it is not possible to set the corrected dosage in view of the patterns in the protruding region.

For example, in patterns shown in FIG. 2, if the size of the above described stripe is defined by the maximum deflection widths of a main deflecting system and sub-deflecting system of the lithography system to divide the whole region to be written by the defined stripe, a pattern 151 arranged in a sub-field A is divided by a boundary line between a stripe 1 and a stripe 2. In a case where a corrected dosage is calculated every stripe, the corrected dosages on the regions of the pattern 151 belonging to the stripes 1 and 2 are separately calculated. As a result, since the influence of the proximity effect affected by patterns belonging to the adjacent stripes is not considered, there is a problem in that the dimensional precision of the pattern 151 deteriorates in the boundary region between the two stripes, so that it is not possible to write patterns as designed.

On the other hand, separately from the proximity effect correction, in recent years, a multiple writing technique is utilized as a technique for enhancing the dimensional precision and positional precision of patterns. There are various multiple writing methods, one of which is a stripe multiple writing for writing stripes while shifting each of the stripes by a predetermine distance. If this stripe multiple writing and the above described first example of the proximity effect correction are combined to be carried out, there is no problem in the multiple writing of stripes since the irradiation time on the whole reticle has been calculated. However, since it takes very much time to calculate the correction as described above, there is a problem in that the loss time remains being great.

If the stripe multiple writing is combined with the second example, there is the following problem since the proximity effect correction is processed every stripe. That is, assuming that the number of stripes is n (n: natural number) in the writing data stage, when the multiple writing is carried out four times, the correction corresponding to 4n stripes must be carried out. Therefore, it is required to improve the processing speed of the correcting circuit in accordance with the 4n stripes.

Thus, in the multiple writing, it is difficult to effectively incorporate a proximity effect correcting circuit. In addition, if the region of the dosage data is expanded so as to include the auxiliary region in order to carry out the proximity effect correction with respect to the above described protruding pattern, there is a problem in that the coordinates of the dosage data corresponding to the intermediate stripe for the multiple writing are shifted, so that it is not possible to carry out a precise setting.

SUMMARY OF THE INVENTION

It is therefore an object of the present invention to eliminate the aforementioned problems and to provide a charged beam lithography system capable of rapidly writing patterns even on each of adjacent chips while correcting a dosage in view of the influence of the proximity effect.

It is another object of the present invention to provide a charged beam lithography system capable of rapidly carrying out corrections while coping with both the multiple writing and the proximity effect correction.

It is a further object of the present invention to provide a charged beam lithography system capable of realizing precise corrections when the proximity effect correction is carried out every stripe in the multiple writing.

According to the first aspect of the present invention, there is provided; a charged beam lithography system comprising: a charged particle optics system for causing a surface of a substrate to be irradiated with a charged beam to a pattern to be written, on the basis of writing data, which are obtained by processing data of said pattern by a predetermined conversion, a proximity effect correction calculating circuit for calculating a corrected dosage by correcting a dosage of said charged beam corresponding to said pattern in view of the influence of the proximity effect wherein charge beam exposures to adjacent patterns are increased by backward scattered electrons produced on the surface of said substrate by the irradiation with said charged beam, a data converter for converting said pattern data into intermediate data to be converted into said writing data, an intermediate data combining circuit for combining said intermediate data, which have been converted from data of said pattern in adjacent first regions, to prepare combined intermediate data corresponding to a pattern in a second region greater than said first regions, and, a controller for supplying said combined intermediate data to said proximity effect correction calculating circuit to cause said proximity effect correction calculating means to calculate a correction in said second region to supply the calculated result to said charged beam lithography system to cause said charged beam lithography system to carry out a continuous write operation on said second region.

According to the first aspect of the present invention, intermediate data converted by data converter are combined by intermediate data combining circuit, so that it is possible to prepare writing data for a second region in a short time. Thus, it is possible to merge a plurality of chip data arranged on the same substrate in a short time to make one chip, whereas in the prior art, after writing data for each of chips are combined with each other, it is required to newly carry out the tone reversal, resize, scale factor adjustment, overlap removal and design rule check of patterns.

In addition, patterns in a plurality of first regions adjacent to each other are combined with each other to prepare patterns in a second region, so that the proximity effect correction can be carried out in view of information on the adjacent patterns in the end portions of the respective patterns. Thus, it is possible to precisely write patterns up to the end portions thereof.

According to the second aspect of the present invention, there is provided; a charged beam lithography system comprising: a charged particle optics system having a charged particle gun for generating charged beams, a main deflecting system and a sub-deflecting system for deflecting said charged beam shot by said charged particle gun, and a stage for mounting a substrate thereon, said charged particle optics system causing the surface of said substrate to be irradiated with said charged beams from said charged particle gun while continuously moving said stage, to write a desired pattern for each of stripes defined by the maximum deflection widths of said main deflecting system and said sub-deflecting system, a proximity effect correcting circuit for calculating an optimum dosage for each of said stripes by correcting the dosage of said charged beam in view of the influence of the proximity effect, a storage device for storing data of said optimum dosage for at least two of said stripes, and, a controller for selectively taking said optimum dosage data out of said storage device so as to correspond to each of stripe to be written at each number of writing while shifting a divided form of the whole region to be written using said stripes at each number of writing, by a predetermined distance from a predetermined reference position in a direction perpendicular to a stage continuous moving direction, to supply the taken-out data to said charged particle optics system to cause said charged particle optics system to multiple-write the same pattern on the surface of said substrate by a plurality of times.

According to the second aspect of the present invention, the dosage data for the intermediate stripe in the multiple writing can be calculated by dividing or combining the optimum dosage data for two continuous stripes to be written in the single writing operation. Thus, the optimum dosage has only to be calculated every stripe on the writing data, so that it is not required to newly calculate the proximity effect correction for the intermediate stripe. As a result, proximity effect correction calculating circuit can have the same processing speed as that in the single writing operation without being influenced by the presence of the multiple writing. Thus there is provided a charged beam lithography system capable of coping with both the proximity effect correction and the multiple writing to precisely and rapidly write patterns.

By selectively taking out the optimum dosage data for each of stripes at each number of writing on the basis of the reference position data, it is possible to ensure the continuity of the optimum dosage for patterns divided by the boundary line between adjacent two stripes to be written. If there is not this continuity, there occur errors corresponding to half of a mesh, so that several percents of errors occur as a whole. A mesh is a small region formed by equally dividing the region of a stripe in the form of a lattice. However, according to the third aspect of the present invention, the possibility of the occurrence of such errors can be removed.

According to the third aspect of the present invention, there is provided; a charged beam lithography system comprising: a charged particle optics system having a charged particle gun for generating charged beams, a main deflecting system and a sub-deflecting system for deflecting said charged beams generated by said charged particle gun, and a stage for mounting a substrate thereon, said charged particle optics system causing the surface of said substrate to be irradiated with said charged beams from said charged particle gun while continuously moving said stage, to write a desired pattern for each of first stripes defined by the maximum deflection widths of said main deflecting system and said sub-deflecting system, a data converter for dividing said pattern data every second stripe, which is formed by extending the region of said first stripe in a direction perpendicular to a stage continuous moving direction, to prepare calculating data, a corrected dosage calculating circuit for receiving said calculating data from said data converting means to correct the dosage of said charged beams in view of the influence of the proximity effect to calculate an optimum dosage, and, a controller for removing an overlap portion from said optimum dosage of said second stripes adjacent to each other in a direction perpendicular to a continuous moving direction of said stage on the basis of said optimum dosage data to prepare writing data corresponding to a pattern contained in said first stripe to supply the prepared writing data to said charged particle optical system to cause said charged particle optical system to write said pattern, and for shifting a reference position for setting said first stripe at each writing number of times, by a predetermined distance in a direction perpendicular to the continuous moving direction of said stage to prepare multiple writing data to supply said multiple writing data to said charged particle optics system to cause said charged particle optical system to multiple-write the same pattern on the surface of said substrate by a plurality of times.

If the second stripe has the auxiliary region in the above described charged beam lithography system, it is possible to provide a charged beam lithography system capable of precisely setting a corrected dosage even for patterns divided by the boundary line between first stripes.

In the above-mentioned aspects of the present invention, charged beams include an electron beam and an ion beam.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIGS. 10A through 10D and 11A through 11D are schematic diagrams showing examples of a processing for merging a plurality of chips;

FIGS. 16A through 16C are imaginative diagrams for explaining a multiple writing system in the charged beam lithography system shown in FIG. 14;

DESCRIPTION OF THE PREFERRED EMBODIMENTS

Referring now to the accompanying drawings, the preferred embodiments of the present invention will be described below.

Figure 3:
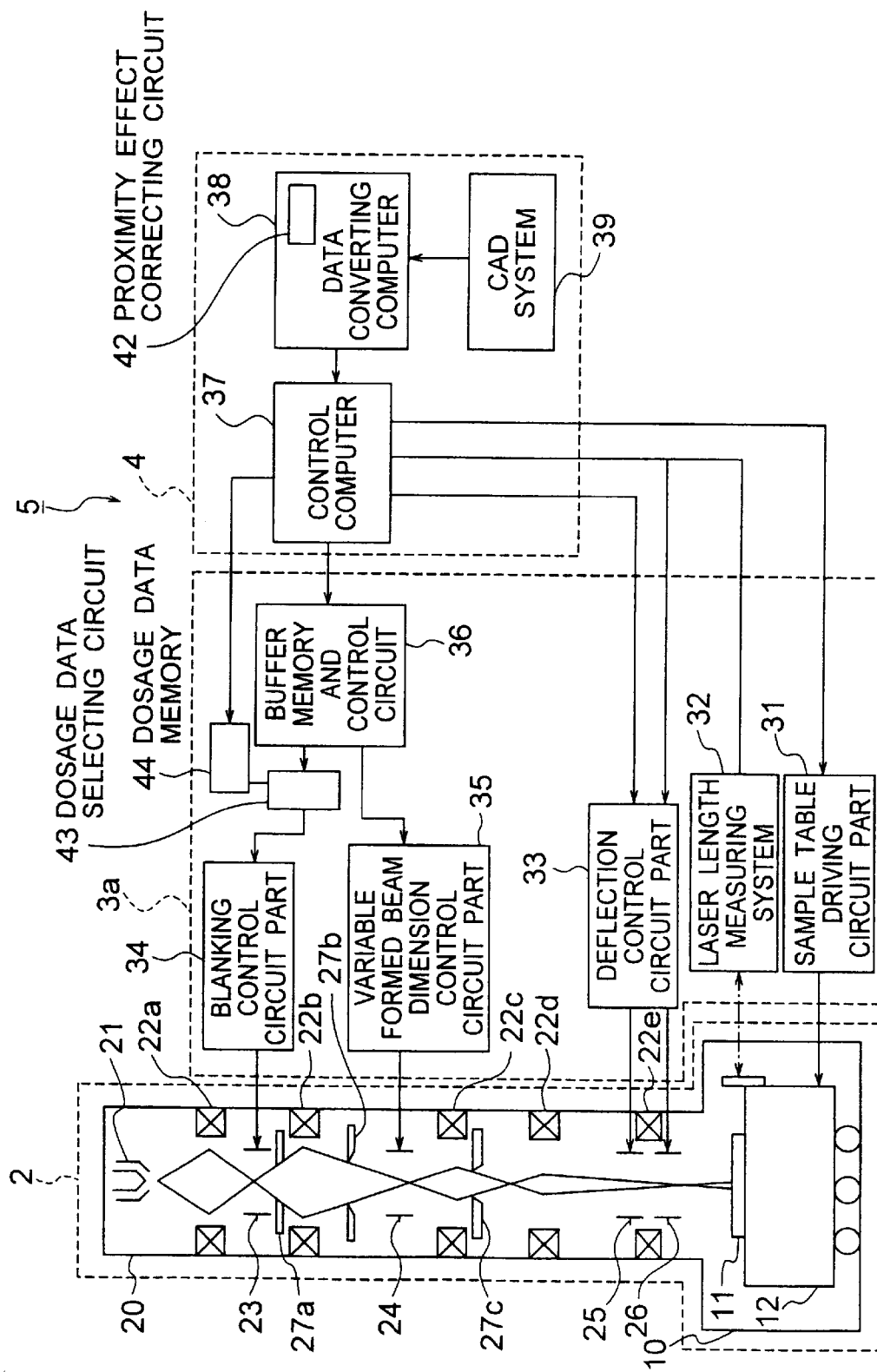
FIG. 3 is a block diagram showing the first preferred embodiment of a charged beam lithography system according to the present invention.

FIG. 3 is a block diagram schematically showing the first preferred embodiment of a charged beam lithography system according to the present invention.

The charged beam lithography system 5 shown in FIG. 3 comprises an electron optics system 2 for causing a substrate 11 to be irradiated with electron beams, a writing control part 3a for controlling the electron optics system 2, and a control part 4 for controlling the whole charged beam lithography system 5.

The electron optics system 2 includes an electron optical lens-barrel 20 and a sample chamber 10. The electron optical lens-barrel 20 includes an electron gun 21, various lens systems 22a through 22e, various deflection systems 23 through 26, a blanking plate 27a, and beam forming aperture masks 27b and 27c. The sample chamber 10 includes a substrate 11 of a wafer or mask, and a stage 12 for supporting the substrate 11 on the upper surface thereof. In this embodiment a substrate 11 is a reticle.

In addition, the writing control part 3a includes a sample table driving circuit part 31 for controlling the movement of the stage 12 and so forth, a laser length measuring system 32, a deflection control circuit part 33, a blanking control circuit part 34, a variable formed beam dimension control circuit part 35, a buffer memory and control circuit 36, a dosage data selecting circuit 43, and a dosage data memory 44.

Moreover, the control part 4 includes a computer aided design (CAD) system 39 for preparing patterns to be written, a data converting computer 38 for converting pattern data, which have been prepared by the CAD system 39, into writing data of a data format for writing the patterns by the electron optics system 2, and a control computer 37, such as a work station. The control computer 37 is designed to read a control software to store the control software in a memory (not shown) to control the charged beam lithography system 5 in accordance with the control software. In addition, the data-converting computer 38 has a proximity effect correcting circuit 42.

The operation of the charged optics system 2 will be briefly described. Electron beams emitted from the electron gun 21 are turned ON and OFF by means of the blanking deflecting system 23. The ON/OFF control of the electron beams is carried out on the basis of dosage data supplied from the dosage data selecting circuit 43. The ON/OFF control allows the adjustment of irradiation time to vary a dosage in accordance with an irradiation position. The electron beam passing through the blanking plate 27a forms a rectangular beam by means of the beam-forming aperture masks 27b and 27c. The size of the rectangular beam is adjusted by means of the beam forming deflecting system 24. Then, the formed electron beam is deflected and scanned on the substrate 11 serving as a target by means of the scanning deflecting systems 25 and 26. By this beam scanning, a desired pattern is written on the substrate 11. The scanning deflecting systems 25 and 26 are called a main deflecting system and a sub-deflecting system, respectively. Each of the main deflecting system 25 and the sub-deflecting system 26 has the maximum deflection width. In this preferred embodiment, the maximum deflection widths of the main deflecting system 25 and the sub-deflecting system 26 are about 1200 $\mu$m and 60 $\mu$m, respectively. The main deflecting system 25 is designed to deflect the electron beam at a long distance between sub-deflection regions (sub-fields). The sub-deflecting system 26 is designed to deflect the electron beam for writing the pattern in the sub-field.

Figure 4:
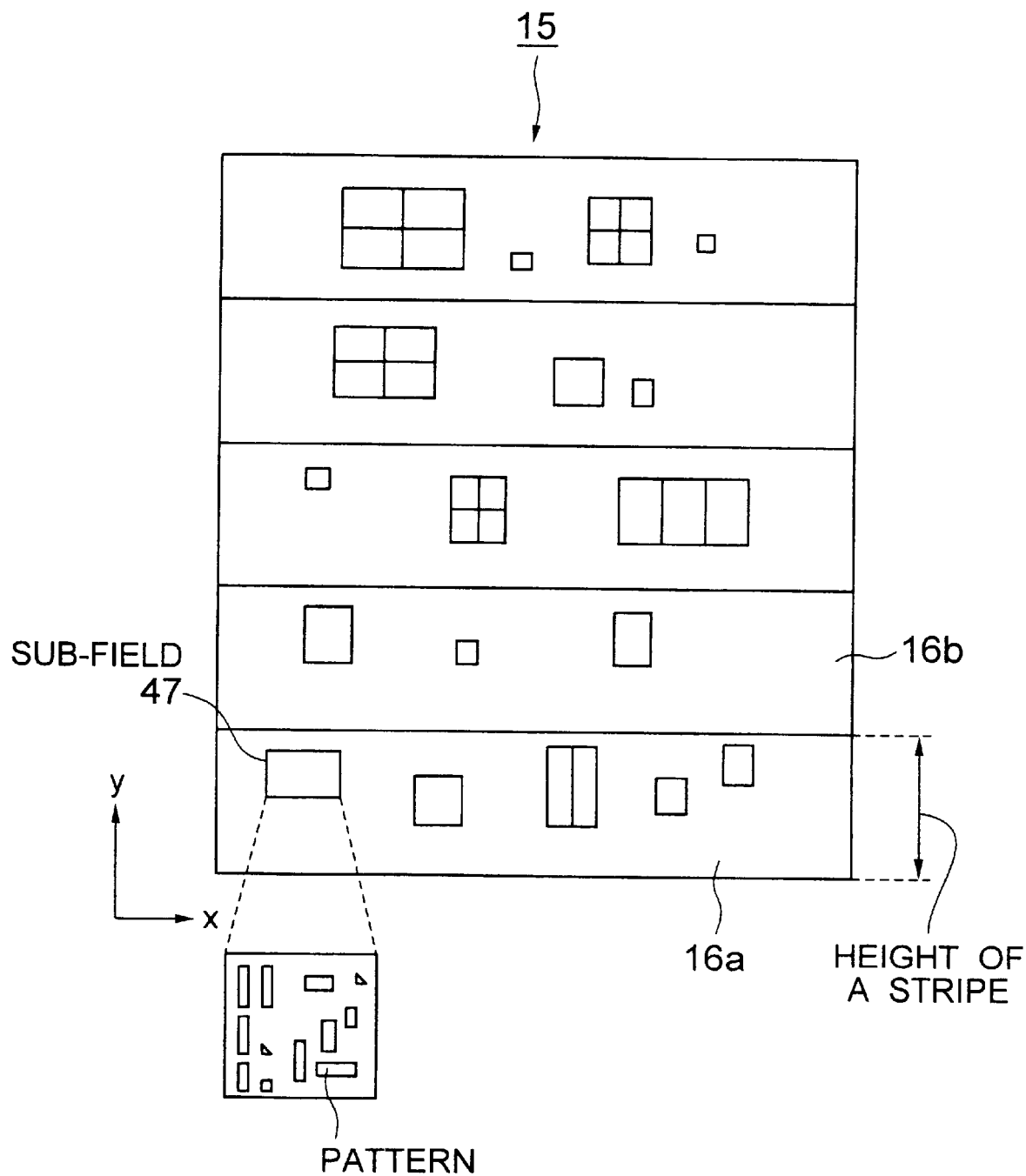
FIG. 4 is a schematic diagram showing the progress of a typical electron beam lithography.

Referring to the schematic diagram of FIG. 4, a typical writing progress will be briefly described. The main deflecting system 25 moves the electron beam between sub-fields 47 (y directions), and the sub-deflecting system 26 writes a pattern in the sub-field 47, e.g., a pattern 101 (x directions). At this time, the stage 12 of the electron optics system 2 moves in x directions, and the maximum deflection width due to the main deflecting system 25 exists in y directions. This is called the height of a stripe. The electron optics system 2 writes a pattern every stripe while moving the stage 11 in x directions. For example, when the writing on a stripe 16a is completed, the stage 11 moves in y directions to write a pattern on the next stripe 16b (stage continuous movement).

The above-described characteristics of the scanning of the electron optics system 2 are reflected in the writing data structure That is, the stripes and sub-fields also exist in the definition of data.

Figure 5:
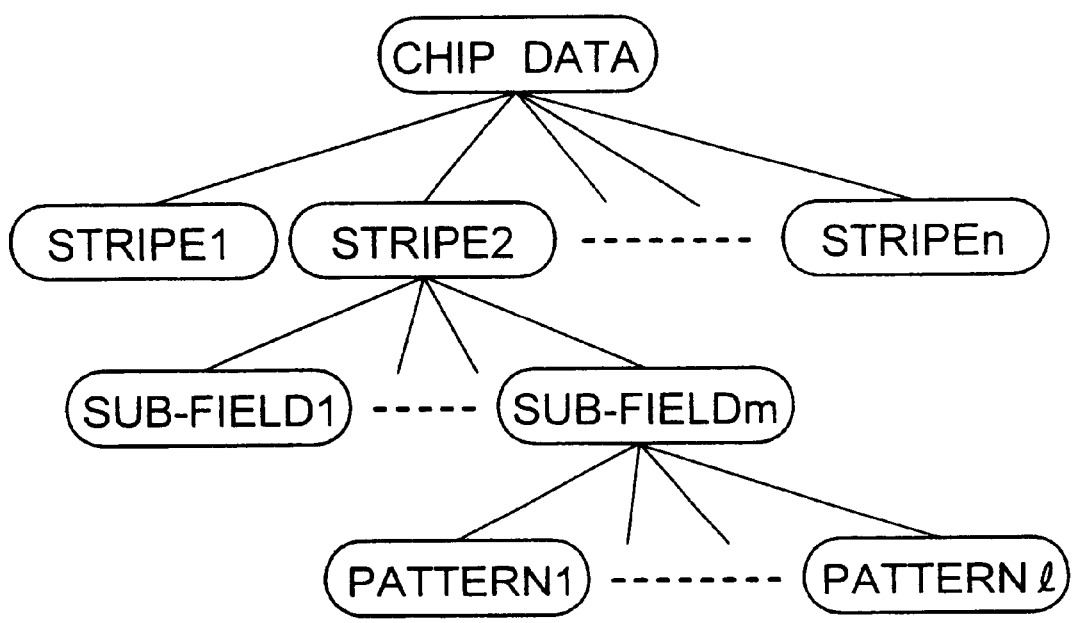
FIG. 5 is a schematic diagram simply showing the data structure of writing data.

FIG. 5 simply shows the data structure. As shown in this figure, the writing data have a hierarchical structure. Chip data comprise n stripes, each of which comprises m sub-fields. Moreover, each of sub-fields includes patterns 1 through 1 to be written.

The charged beam lithography system 5 shown in FIG. 3 can be operated in various ways. These operations will be described. In any ways, the charged beam lithography system in this preferred embodiment is characterized in that the writing data converted from the CAD data are used to combine a plurality of chips to redefine one chip of a new region to continuously write patterns on the substrate.

First, the first way of the operation of the charged beam lithography system 5 will be described.

Figure 6:
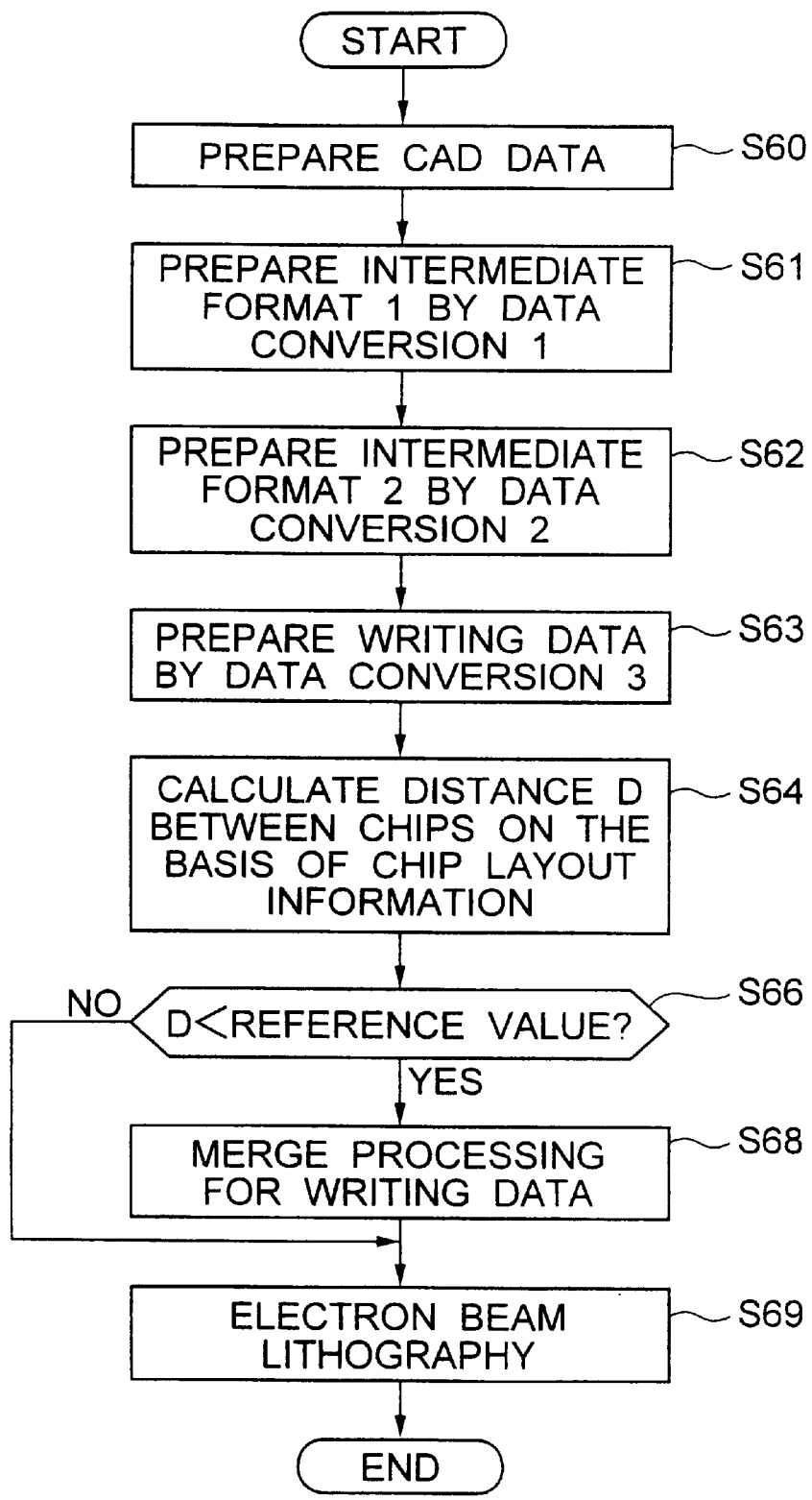
FIG. 6 is a flow chart for explaining the first way of the operation of the charged beam lithography system shown in FIG. 3.

As shown in FIG. 6, CAD data of a pattern to be written by the CAD system 39 are first prepared (step S60). The CAD data are converted into data of an intermediate format 1 by a data conversion 1 using the data-converting computer 38 (step S61). The intermediate format 1 is often a generalized format. Moreover, the data of the intermediate format 1 are converted into data of an intermediate format 2 by a data conversion 2 using the data converting computer 37 (step S62). The data conversion 2 carries out the adjustment of the pattern, such as the tone reversal, resize, scale factor adjustment, overlap removal and design rule check of the pattern. Then, the data of the intermediate format 2 are converted into writing data by a data conversion 3 using the data converting computer 37 (step S63). The writing data, together with data layout information for the pattern for the charged beam lithography system (which will be hereinafter referred to as "chip layout information"), are supplied to the control computer 37. Then, a distance D between adjacent chips is calculated on the basis of the chip layout information (step S64) to be compared with a predetermined reference value (step S66). If the distance D between adjacent chips is smaller than the reference value (step S66), a processing for merging the writing data with respect to adjacent chips is carried out (step S68) to supply the merged writing data, together with the chip layout information, to the writing control part 3a. Then, the writing control part 3a controls the electron optics system 2 to cause the electron optics system 2 to carry out a continuous writing operation (step S69). On the other hand, if the distance D between adjacent chips is not smaller than the reference value (step S66), the writing control part 3a causes the electron optics system 2 to carry out a usual writing operation without carrying out the merging processing (step S69).

Preferably, the size of each of the stripes and sub-fields can be optionally selected for each of the chips. For that purpose, before the writing data for a plurality of chips are merged to prepare writing data for one chip, it is required to make the sizes of the chips even. In the charged beam lithography system 5 in this preferred embodiment, the stripes and sub-fields are first arranged between the plurality of chips, and thereafter, the coordinates are changed. Thus, pluralities of chips become one chip on the data structure.

Figure 7:
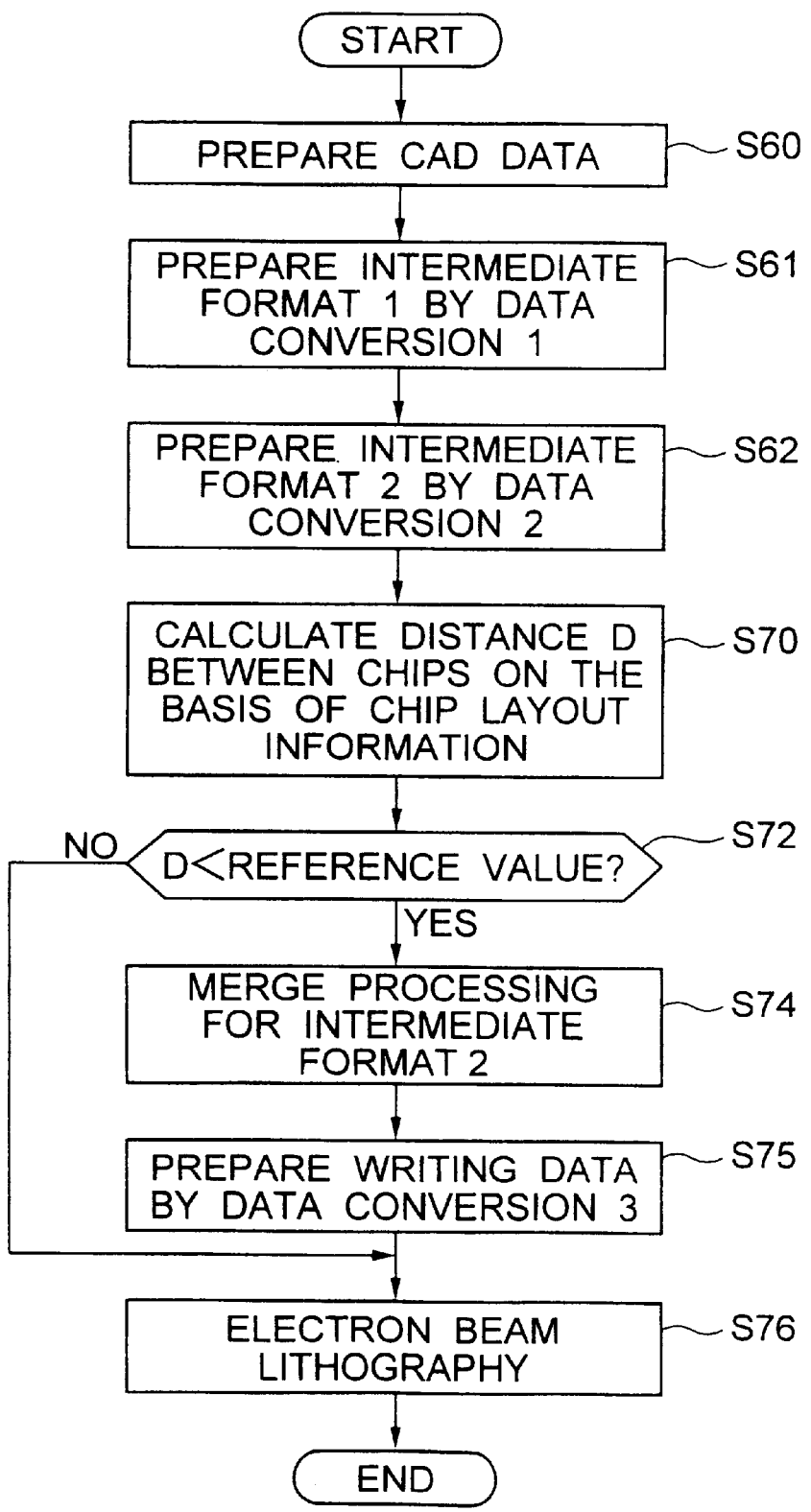
FIG. 7 is a flow chart for explaining the second way of the operation of the charged beam lithography system shown in FIG. 3.

Referring to the flow chart of FIG. 7, the second way of the operation of the charged beam lithography system 5 shown in FIG. 3 will be described below.

First, similar to the above described first way, after patterns are prepared by the CAD system 39, the data converting computer 38 receives data of the pattern to carry out a data conversion 1 and a data conversion 2 to prepare an intermediate format 1 and an intermediate format 2 (steps S60 through step S62).

Then, a distance D between adjacent chips is calculated on the basis of the chip layout information (step S70) to be compared with a predetermined reference value (step S72). If the distance D between adjacent chips is smaller than the reference value (step S72), a processing for merging the intermediate format 2 for adjacent chips is carried out (step S74). Thereafter, a data conversion 3 of the merged intermediate format 2 is carried out to prepare writing data (step S75), and the writing control part 3a causes the electron optics system 2 to carry out the continuous writing operation (step S76). If the distance D between adjacent chips is not smaller than the reference value (step S72), the writing control part 3a causes the electron optics system 2 to carry out the usual writing operation without carrying out the merging processing (step S75 and S76).

Figure 8:
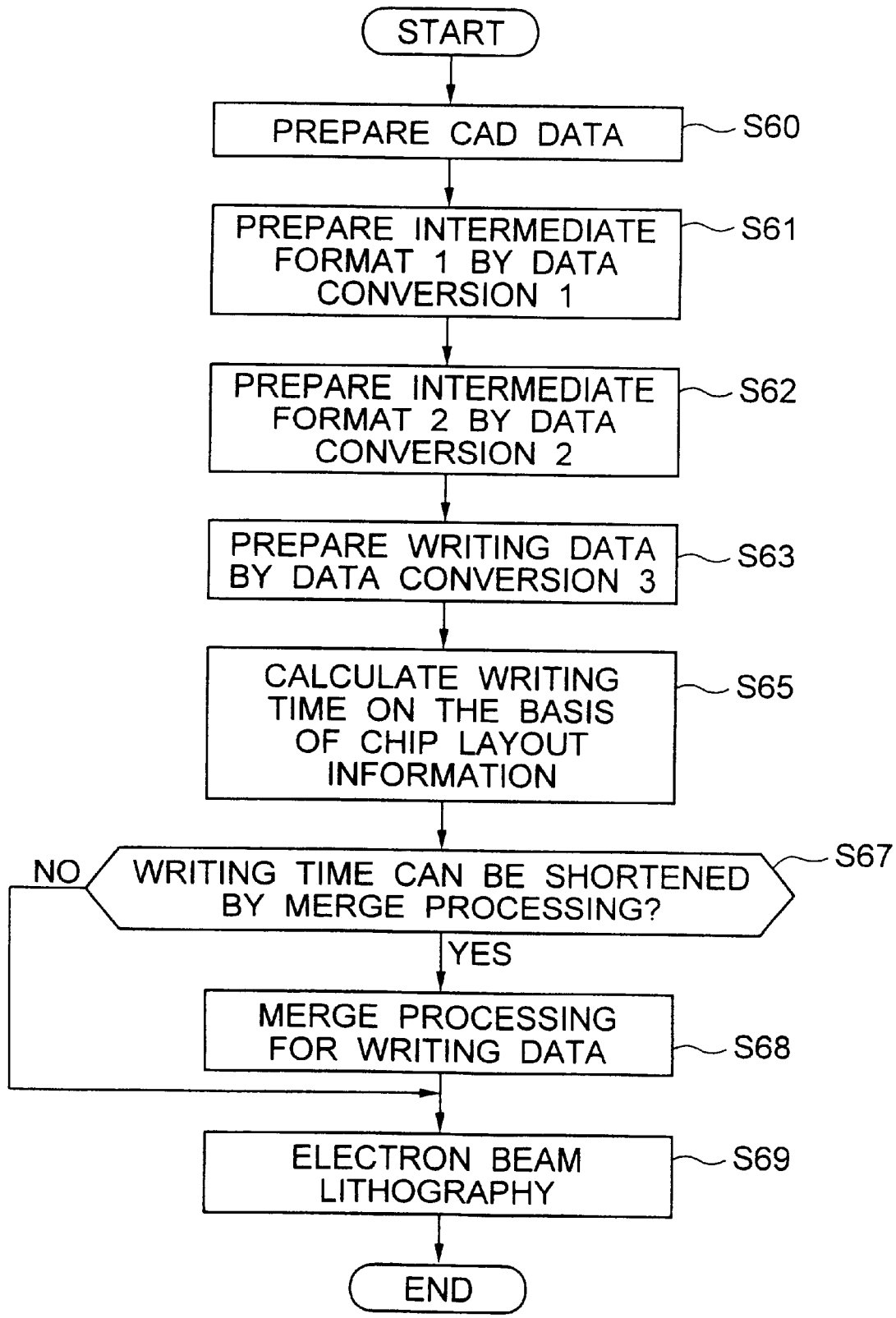
FIG. 8 is a flow chart for explaining the third way of the operation of the charged beam lithography system shown in FIG. 3.

Referring to the flow chart of FIG. 8, the third way of the operation of the electron beam lithography system 5 shown in FIG. 3 will be described below. In this way, the procedure for determining whether the data merging processing should be carried out is different from that in the above described first operation way. Other procedures are the same as those in the first operation way.

That is, similar to the first operation way, after patterns are prepared by the CAD system 39, a data conversion 1 and a data conversion 2 are carried out for the pattern data to prepare writing data by a data conversion 3 via an intermediate format 1 and an intermediate format 2 (steps S60 through step S63).

Then, time required to write (which will be hereinafter referred to as a "writing time") a region of adjacent chips to be written is calculated on the basis of the chip layout information (step S65) to determine whether the writing time can be shortened by combining the writing data for adjacent chips (step S67). If it is determined that the writing time can be shortened by combining the writing data for adjacent chips (step S67), the writing data for adjacent chips are merged (step S68), and the writing control part 3a causes the electron optics system 2 to carry out the continuous writing operation (step S69). On the other hand, if it is determined that the writing time can not be shortened even if the writing data are combined (step S67), the writing control part 3a causes the electron optics system 2 to carry out the usual writing operation without carrying out the merging processing (step S69).

Figure 9:
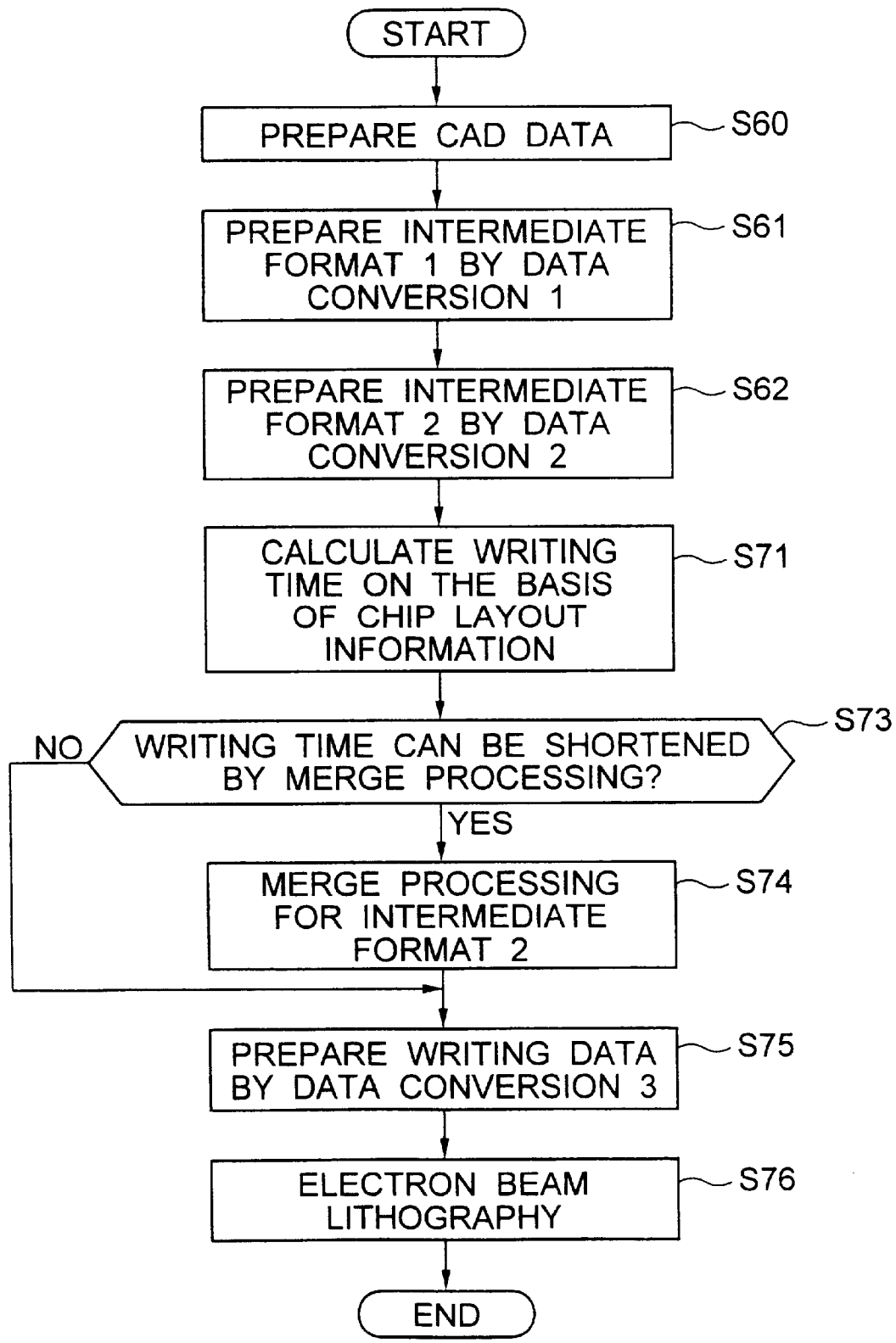
FIG. 9 is a flow chart for explaining the fourth way of the operation of the charged beam lithography system shown in FIG. 3.
Figure 11A:
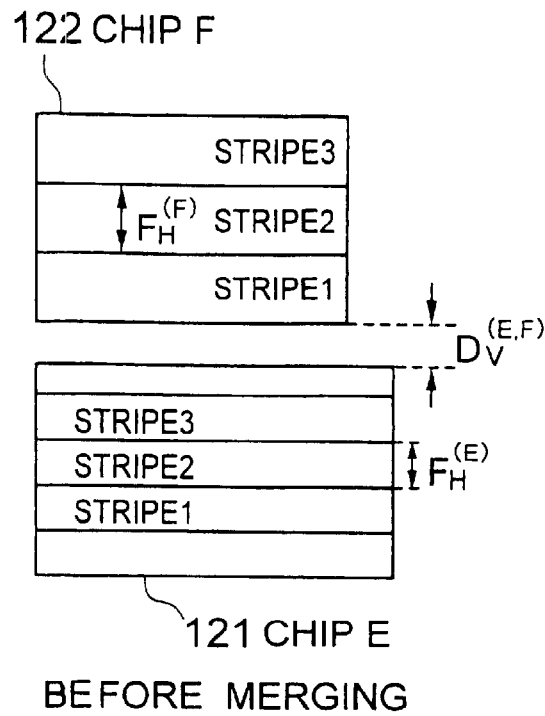
Figure 11C:
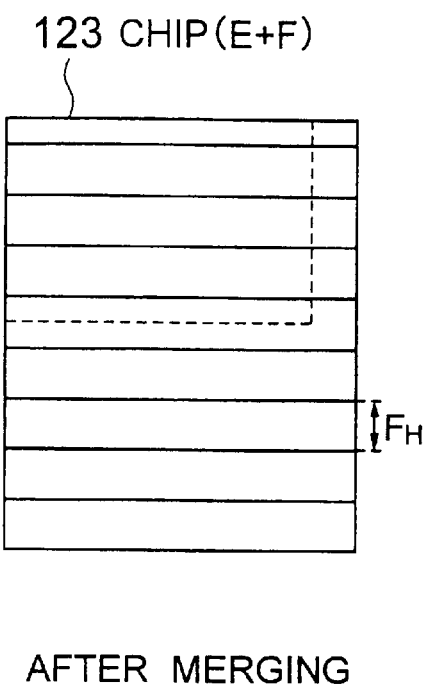
Figure 11B:
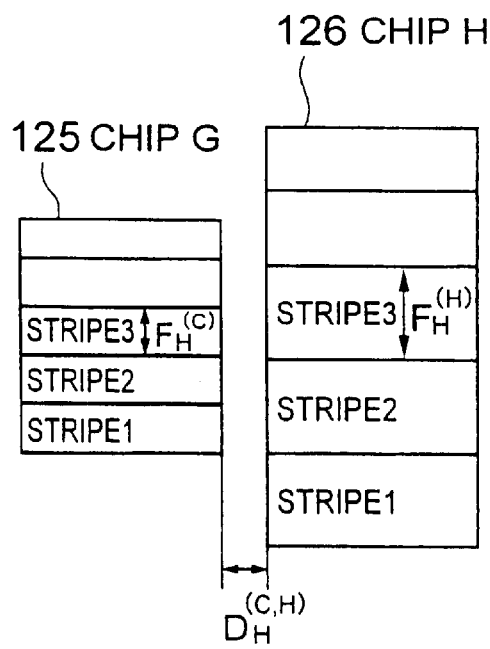
Figure 11D:
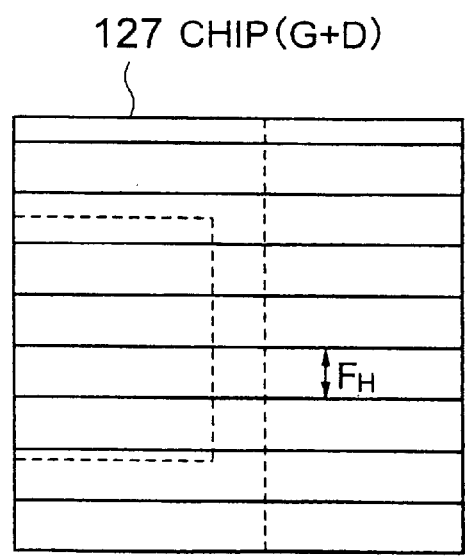

Referring to the flow chart of FIG. 9, the fourth way of the operation of the charged beam lithography system 5 shown in FIG. 3 will be described. Also in this operation way, the procedure for determining whether the data merging processing should be carried out is different from that in the above described second operation way. Other procedures are the same as those in the second operation way.

First, similar to the above described second operation way, after patterns are prepared by the CAD system 39, a data conversion 1 and a data conversion 2 are carried out for the pattern data to prepare an intermediate format 1 and an intermediate format 2 (steps S60 through step S62).

Then, a writing time for a region of adjacent chips to be written is calculated on the basis of the chip layout information (step S71) to determine whether the writing time can be shortened by combining the writing data for adjacent chips (step S73). If it is determined that the writing time can be shortened by combining the writing data for adjacent chips (step S73), the intermediate format 2 for adjacent chips is merged (step S74), and a data conversion 3 for the merged intermediate format 2 is carried out to prepare writing data (step S75). Then, the writing control part 3a causes the electron optics system 2 to carry out the continuous writing operation (step S76). On the other hand, if it is determined that the writing time can not be shortened even if the merging processing is carried out (step S73), the data conversion 3 for each of the chips is carried out to prepare writing data (step S75) without carrying out the merging processing, and the writing control part 3a causes the electron optics system 2 to carry out the usual writing operation (step S76).

Some examples of such processing for merging a plurality of chips are shown in the schematic diagrams of FIGS. 10A through 10D and 11A through 11D. In these examples, a processing for merging adjacent two chips is carried out. FIGS. 10A, 10B, 11A and 11B show chips before merging, and FIGS. 10C, 10D, 11C and 11D show chips after merging. Furthermore, in these drawings, $D_H$ denotes the distance between chips in x directions, $D_V$ denotes the distance between chips in y directions, and $F_H$ denotes the height of a stripe.

In any of four examples shown in FIGS. 10A through 11D, the merging processing is carried out so that a new region serving as a second region of a chip includes the whole region (a first region) of each of the chips before merging and the chip has a rectangular shape of the minimum area. Furthermore, the charged beam lithography system 5 in this preferred embodiment has an acceleration voltage of 50 kV, which is a normal acceleration voltage of an electron beam. In this case, the backward scattering range $\delta_b$ serving as a range influenced by the proximity effect is about 10 μm.

Figure 12A:
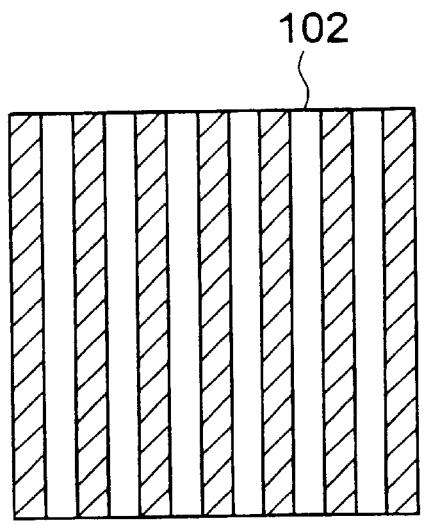
FIGS. 12A through 12C are schematic diagrams for explaining effects of the charged beam lithography system shown in FIG. 3.
Figure 12B:
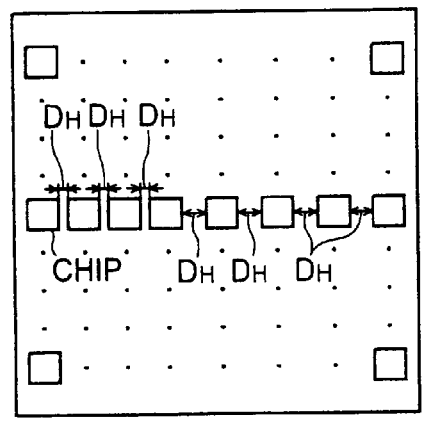
Figure 12C:
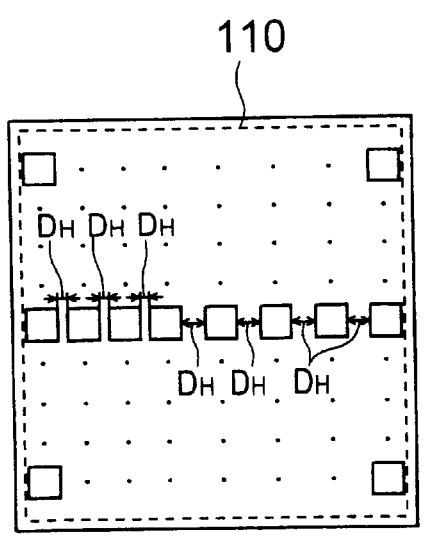

Effects obtained by writing patterns on chips using the charged beam lithography system 5 shown in FIG. 3 will be described in comparison with the writing effects of conventional electron beam lithography. In the lithography, there was used a glass (Qz), on which chromium (Cr) was deposited and which was a shading mask substrate. As a resist, a positive resist for electron beams was used. FIGS. 12A through 12C show an evaluating pattern on each of chips, and the layout of each of chips. The pattern on an evaluation chip shown in FIG. 12A was a pattern 102 having a line and space of 1:1, the design dimension thereof was 2.0 μm, and the pitch thereof was 4.0 μm. The chip has a height (x directions) of 100 μm, and a width (y directions) of 100 μm.

Figure 13:
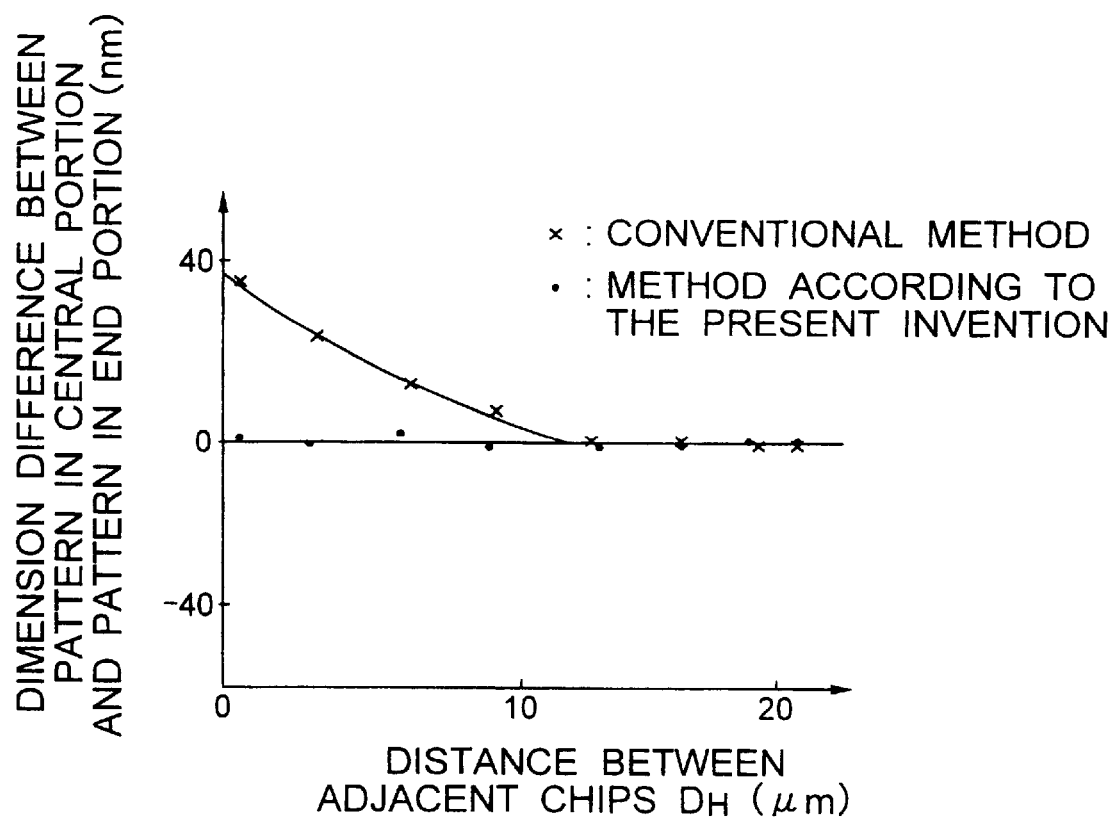
FIG. 13 is a characteristic diagram for explaining the precision of the proximity effect correction using the charged beam lithography system shown in FIG. 3.

Since the backward scattering range $\sigma_b$ is about 10 μm, the central portion of the evaluation chip is not influenced by the proximity effect from each of adjacent chips. That is, since the central portion of each of the evaluation chips receives the same quantity of backward scattered electrons from only the pattern in the chip's own, each of the patterns is finished so as to have the same dimension. FIG. 12B shows a chip layout prepared by a conventional method. In this figure, each of chips was independently defined, and the proximity effect correction was independently carried out. FIG. 12C shows a chip layout prepared by the charged beam lithography system 5 shown in FIG. 3. As shown in this figure, all of chips are defined as one chip 110. Therefore, the proximity effect correction is carried out on the basis of the definition of one chip. After chip data were prepared, data were prepared in the first operation way (FIG. 6) for merging each of chips. In FIGS. 12B and 12C, the distance $D_H$ between chips was set to be in the range of from 0.5 μm to 20.0 μm. After the written pattern was developed to pattern chromium (Cr) by the wet etching, the glass (Qz) portion was measured by a length measuring scanning electron microscope (a length measuring SEM). The dimension of the pattern in the end portion of each of the chips and the dimension of the pattern in the central portion of each of the chip were measured, and the difference between the dimensions was calculated to certify the precision of the proximity effect correction. The measured results are shown in FIG. 13. In this figure, the axis of abscissas denotes the distance $D_H$ between adjacent chips, and the axis of ordinates denotes the difference between the dimension of a pattern in the end portion of each of chips and the dimension of the pattern in the central portion of each of the chips. As can be seen from FIG. 13, according to the conventional method, the maximum difference between the dimensions is about 40 nm when the distance between adjacent chips is approximately the back scattering radius $\sigma_b$. On the other hand, according to the present invention, there was found little difference at all of the differences between adjacent chips, about several nm or less. As a result, it was confirmed that it is possible to precisely carry out the proximity effect correction according to the present invention.

Referring to the accompanying drawings, the second preferred embodiment of a charged beam lithography system according to the present invention will be described below.

Figure 14:
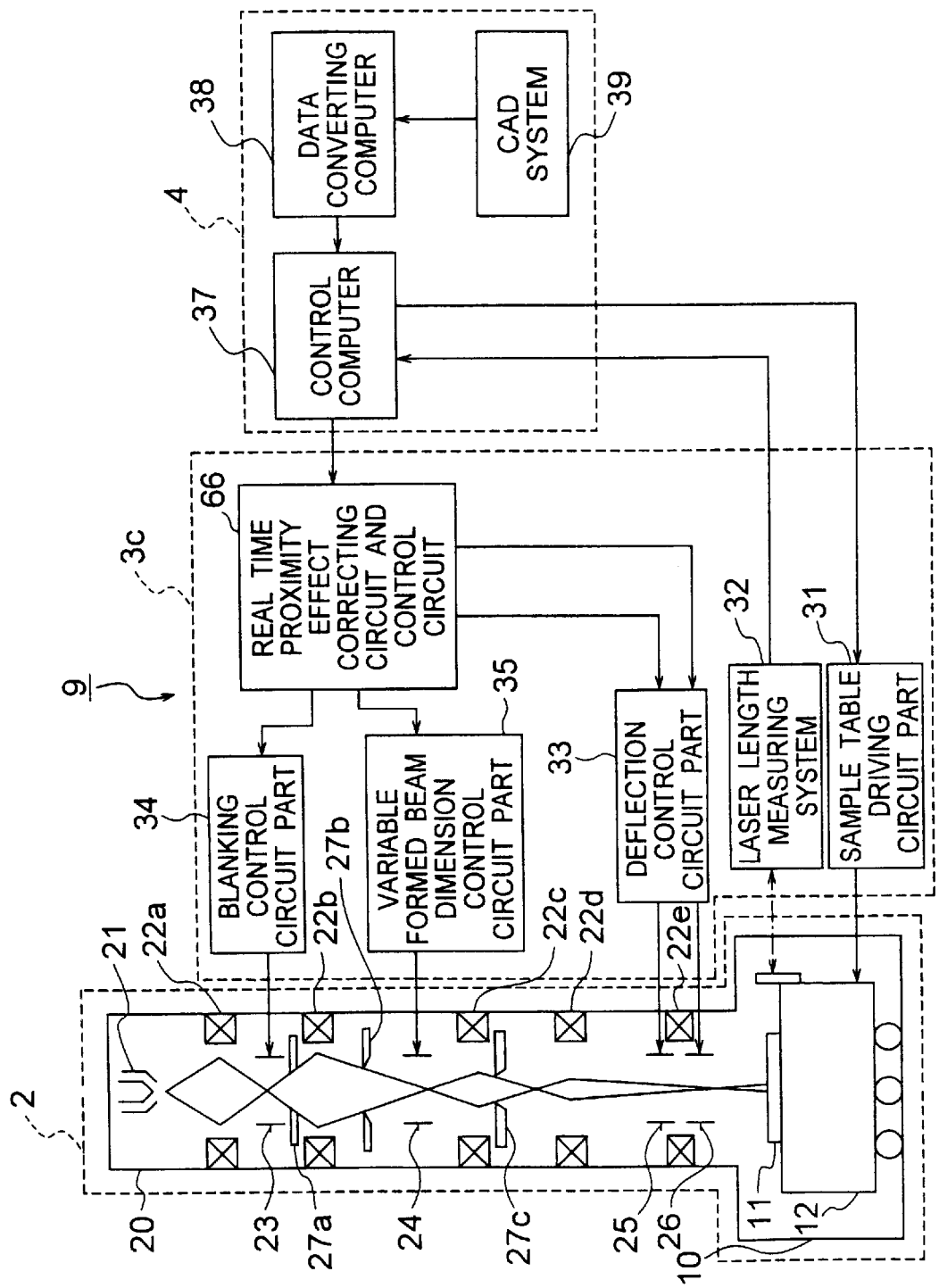
FIG. 14 is a block diagram showing the second preferred embodiment of a charged beam lithography system according to the present invention.

FIG. 14 is a block diagram schematically showing a charged beam lithography system 9 in this preferred embodiment. The charged beam lithography system 9 shown in this figure is characterized by a writing control part 3c which includes a real time proximity effect correcting circuit and control circuit 66 in addition to a sample table driving circuit part 31, a laser length measuring system 32, a deflection control circuit part 33, a blanking control circuit part 34 and a variable formed beam dimension control circuit part 35. Other constructions are substantially the same as those of the charged beam lithography system 5 shown in FIG. 3, except for the contents of a program of a control software which is read by a control computer 37 and which is stored in a memory (not shown). Furthermore, also in the charged beam lithography system 9, the acceleration voltage to electron beams is 50 kV. In addition, the maximum producible variable formed beam has a rectangular shape having a height of 2 μm and a width of 2 μm.

The charged beam lithography system 9 shown in FIG. 14 adopts a stage continuous moving system. That is, the charged beam lithography system 9 is designed to write patterns by controlling the position of a beam by deflecting the beam while continuously moving the stage 11.

Figure 15:
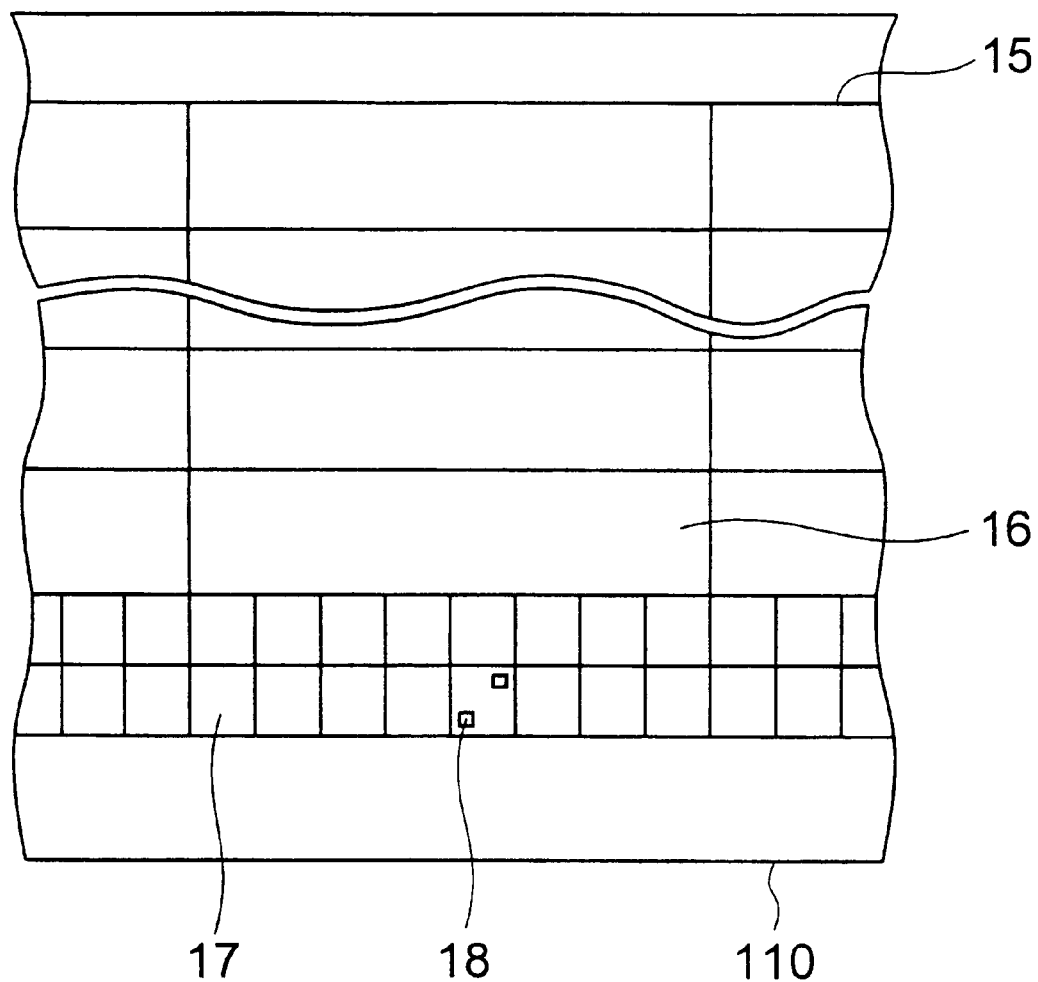
FIG. 15 is a schematic diagram for explaining a region to be written on a substrate.

FIG. 15 is a schematic diagram for explaining a region to be written. A stripe 16 in a region 15 is a region to be written by one stage continuous movement. The whole target pattern is written by repeating such a writing operation based on the continuous movement. During the continuous movement, the position of the beam is controlled by means of the main defecting system 25 and the sub-deflecting system 26. Specifically, each of stripes 16 is divided into small regions 17 called meshes, and each mesh is irradiated with a beam shot 18 to write patterns.

The charged beam lithography system 9 shown in FIG. 14 also adopts a multiple writing system, i.e., a system for writing patterns while shifting a region to be written in a direction perpendicular to the stage continuous moving direction.

Referring to the schematic diagrams of FIGS. 16A through 16C, the multiple wiring system of the charged beam lithography system 9 will be briefly described below.

FIG. 16A imaginatively shows an example of data for a pattern on an LSI chip, which is to be written on the substrate 11 (the data will be hereinafter referred to as "chip data"). The chip data are divided into a plurality of stripes on data. FIG. 16A imaginatively shows an example of chip data divided into five stripes for simplified descriptions. The chip data divided into stripes will be hereinafter referred to as "data striped".

FIG. 16B shows stripes (which will be hereinafter referred to as "stripes to be written") when a pattern is actually written on the substrate 11 using the chip data shown in FIG. 16A.

The first writing on the substrate 11 is carried out on a stripe to be written 1 shown by a broken line in FIG. 16B. The upper half region of the stripe to be written 1, which is formed by dividing the written stripe 1 into two parts in the stage moving direction, corresponds to the lower half data for the data stripe 1 of FIG. 16A, which is obtained by the data stripe 1 into two parts in the stage moving direction. First, the electron beam lithography system 9 writes the stripe to be written 1 while continuously moving the stage 12.

Then, the charged beam lithography system 9 moves the stage 12 by (the height of the stripe)/2 in a direction perpendicular to the continuous moving direction, and then, writes a stripe to be written 2 while continuously moving the stage 12 again. As can be seen clearly from the comparison with FIG. 16A, the region of the stripe to be written 2 of FIG. 16B is coincident with the region of the data stripe 1 of FIG. 16A. Thereafter, the stage 12 is moved again by (the height of the stripe)/2 in a direction perpendicular to the continuous moving direction to write a stripe to be written 3. At this time, the upper half region of the data stripe 1 of FIG. 16A and the lower half region of the data stripe 2 of FIG. 16A are written. While such a procedure is sequentially repeated, stripes to be written 4, 5,... are written, so that the whole chip region is written.

FIG. 16C shows the structure of the stripe to be written 1 in the case of a quadruple writing operation. Similar to the double writing operation of FIG. 16B, the writing operation is carried out in order of the number of the stripe to be written.

Furthermore, though the stripes to be written 1, 3, 5, 7, 9 and 11 in FIG. 16B are shown rightward of the stripes to be written 2, 4, 6, 8, 10 in FIG. 16B and the stripes to be written 1, 2 and 3 in FIG. 16C are shown rightward of the stripes to be written 4, such shift in the right direction is conducted for explanation purpose only and not carried out in the actual writing operation.

Figure 17:
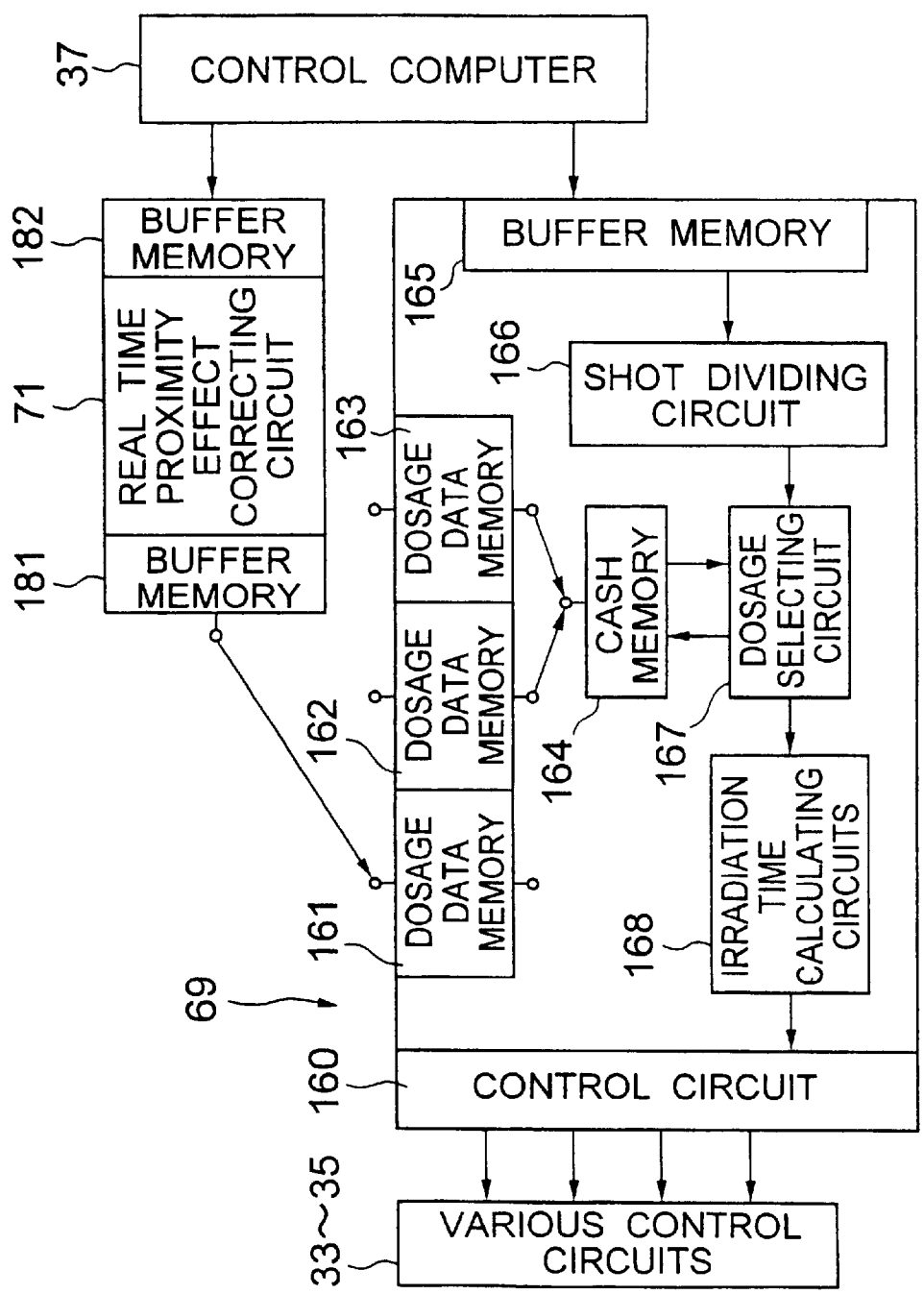
FIG. 17 is a block diagram showing the details of a writing circuit of the charged beam lithography system shown in FIG. 14.

FIG. 17 is a block diagram showing the details of the real time proximity effect correcting circuit and writing circuit 66 which is one of the features of this preferred embodiment. As shown in this figure, the real time proximity effect correcting circuit and writing circuit 66 includes a real time proximity effect correcting circuit 71, buffer memories 181, 182, and a writing circuit 69. The writing circuit 69 has a dosage data memories 161 through 163, a cash memory 164, a buffer memory 165, a shot dividing circuit 166, a dosage selecting circuit 167, an irradiation time calculating circuit 168, and a control circuit 160.

Referring to FIGS. 18A through 18D, a procedure for calculating optimum dosage data using the real time proximity effect correcting circuit 71 will be described below.

Figure 18:
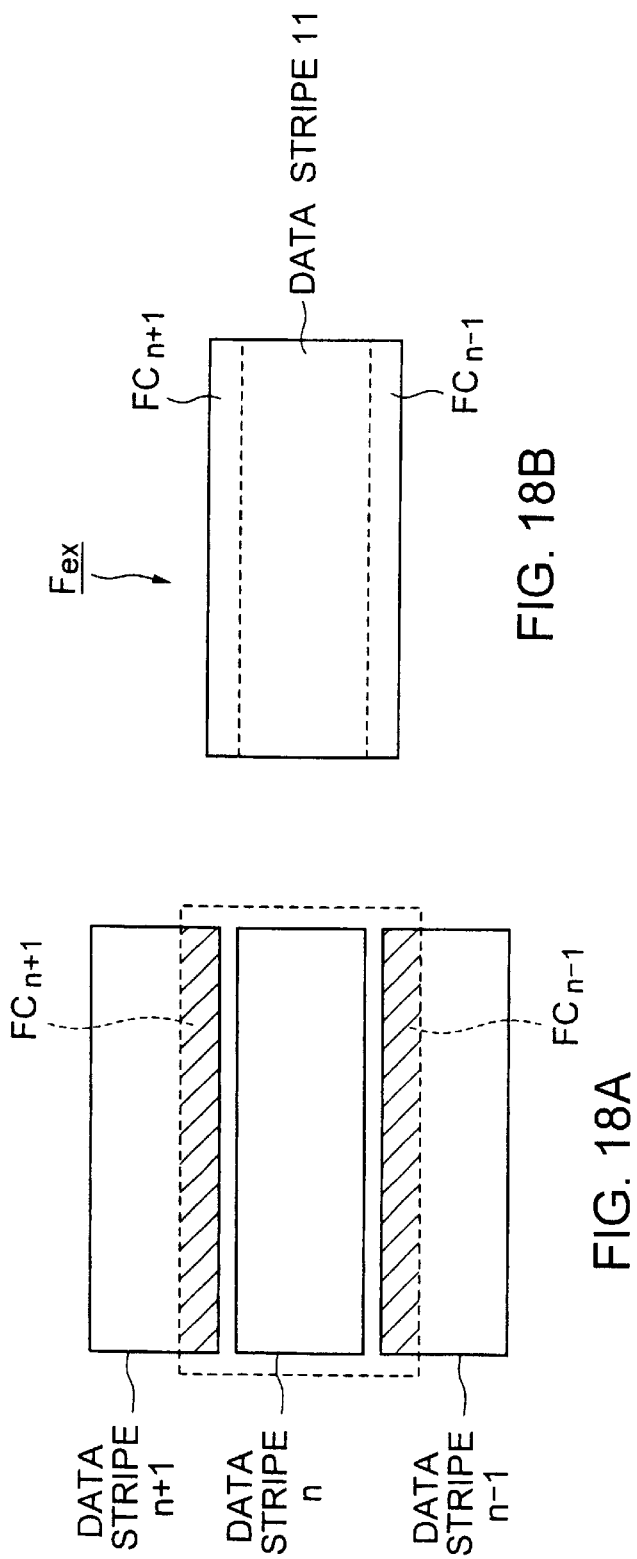
FIGS. 18A through 18D are imaginative diagrams for schematically explaining a procedure for calculating optimum dosage data by the charged beam lithography system shown in FIG. 14.

FIG. 18A imaginatively shows a data stripe n, and data stripes n−1 and n+1 adjacent thereto.

In order to correct the proximity effect for the data stripe n, the control computer 37 supplies pattern data for the data stripe n to the real time proximity effect correcting circuit 71, and supplies patterns of portions (which will be hereinafter referred to as "auxiliary regions FCn−1, FCn+1), which are shown by slant lines in FIG. 18A, of the patterns of the adjacent data stripes n−1 and n+1 to the real time proximity effect correcting circuit 71. These data have been previously stored in a memory (not shown) of the control computer 37.

As the auxiliary region FC, it is sufficient to select a pattern existing in a region extending from the boundary of the data stripe n toward each of adjacent data stripes by $6\sigma_b$ ($\sigma_b$: backward scattering range). In this preferred embodiment, since the acceleration voltage of electron beams in the charged beam lithography system 9 is 50 kV, the auxiliary region FC corresponds to a region extending on the figure upward and downward by about 60 μm from the boundary of the data stripe n.

As shown in FIG. 18B, the real time proximity effect correcting circuit 71 corrects the proximity effect on a region $F_{EX}$ including two auxiliary regions FCn−1 and FCnP1 in addition to the data stripe n.

The real time proximity effect correcting circuit 71 carries out corrections in response to a control signal supplied from the control computer 37 on the basis of the control software and as shown in FIG. 18C transfers only the dosage data on a region (D) corresponding to the data stripe n, among the corrected results, to the writing circuit 69 as optimum dosage data (FIG. 18D). The writing circuit 69 writes a pattern on the substrate 11 via various control circuit parts on the basis of the transferred dosage data in accordance with a procedure, which will be described later.

Figure 19:
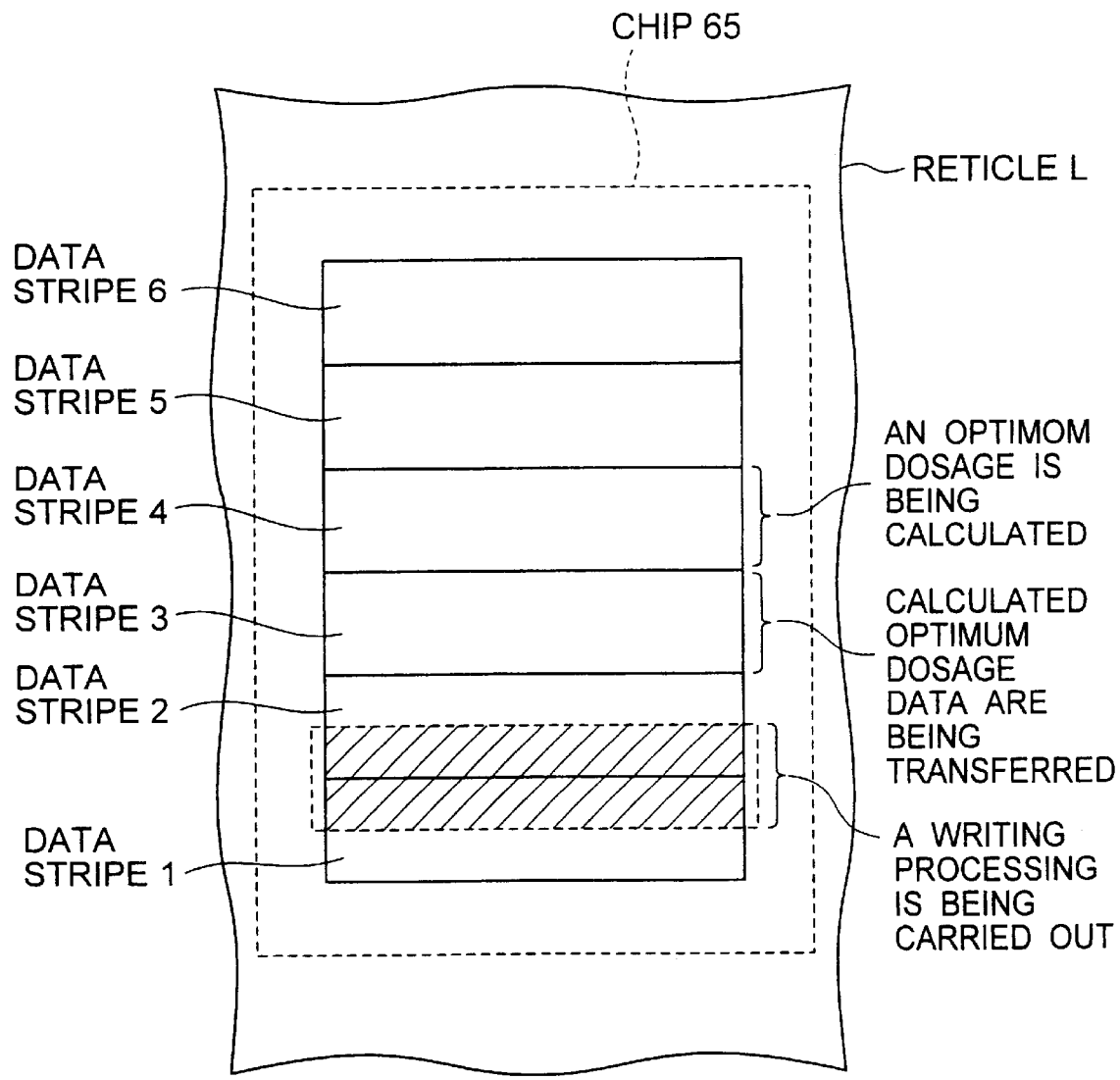
FIG. 19 is a imaginative diagram for explaining the parallel processing for calculating the optimum dosage data, transferring the calculated data and writing patterns in the charged beam lithography system shown in FIG. 14.

One of the features of the charged beam lithography system 9 in this preferred embodiment is that the above described proximity effect correction, the transfer of the optimum dosage data and the writing operation are processed out in parallel. Referring to the imaginative diagram of FIG. 19, this parallel processing will be described. Also in FIG. 19, chip data of a chip 65 of a reticle L are assumed to be divided into six data stripes for simplified descriptions.

For example, in the case of the double writing operation, when the writing circuit 69 carries out a writing processing on an intermediate region between the data stripe 1 and the data stripe 2, the real time proximity effect correcting circuit 71 calculates an optimum dosage on a data stripe 4. At this time, the calculated optimum dosage data are being transferred from the real time proximity effect correcting circuit 71 to the writing circuit 69 since the maximum dosage on the data stripe 3 has been calculated.

Figure 20:
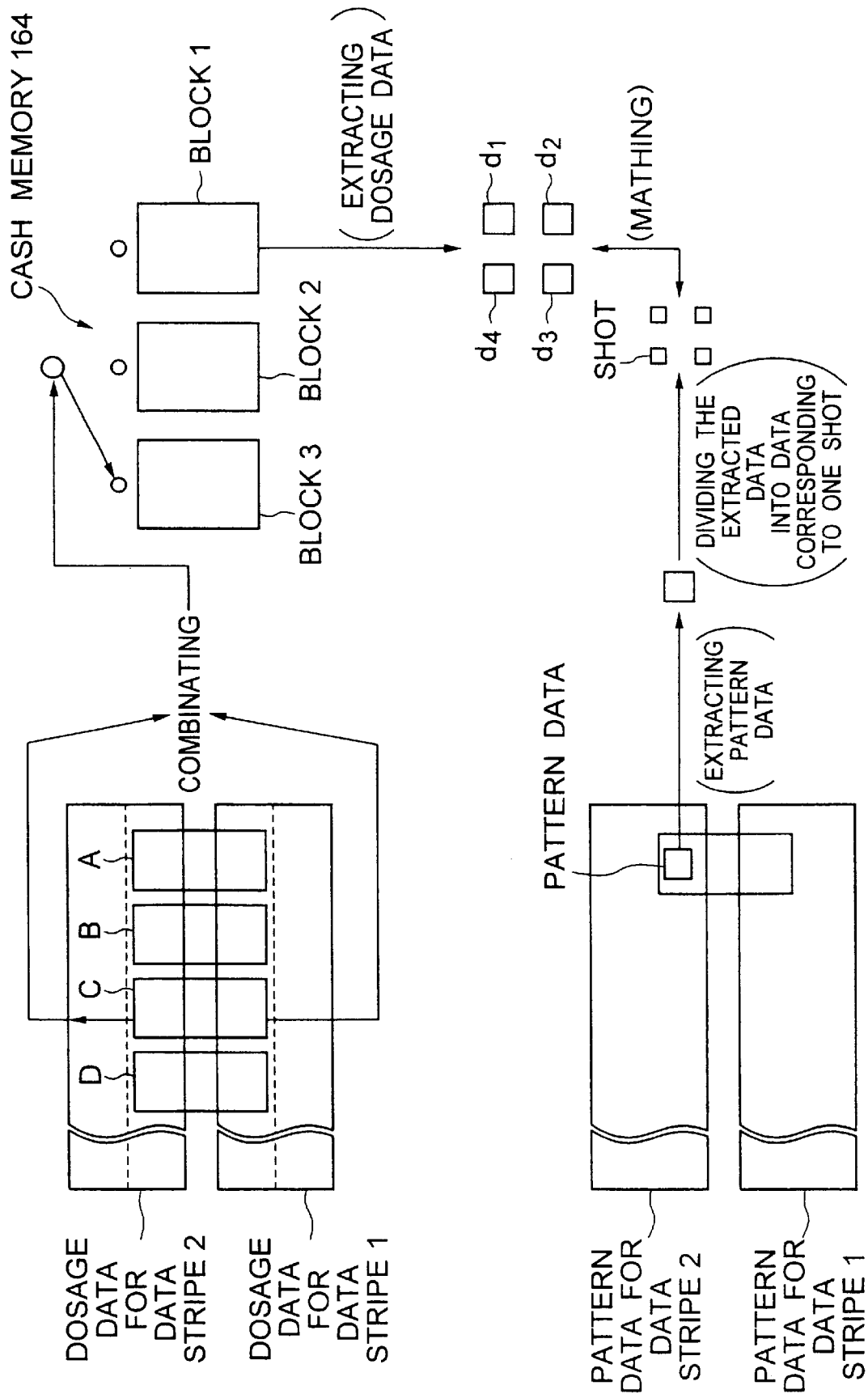
FIG. 20 is a schematic diagram for explaining the operation of the charged beam lithography system shown in FIG. 14.

Referring to FIG. 20, a procedure for matching the optimum dosage data with the pattern data to write a pattern on the intermediate region by means of the writing circuit 69 will be described below.

The dosage data for data stripes 1 and 2 shown in FIG. 20 are the optimum dosage data calculated by the real time proximity effect correcting circuit 71 to be transferred to the dosage data memories 162 and 163 to be stored therein. The writing circuit 69 takes data out of the dosage data for data stripes 1 and 2 every region having a width of 1 mm to store the taken-out data in the cash memory 164. The height of the taken-out data region is set so that the total of a part of the data stripe 1 and a part of the data stripe 2 has the same height as that of the stripe to be written. When the intermediate region is processed in the case of the double writing operation for writing patterns while shifting the stripe half by half, the upper half dosage data for the data stripe 1 and the lower half dosage data for the data stripe 2 are fed to the cash memory 164.

As shown in FIG. 20, the cash memory 164 comprises three blocks. The dosage data for a region A are stored in a block 1, the dosage data for a region B are stored in a block 2, and the dosage data for a region C are stored in a block 3. The data are cyclically stored in the three blocks. Therefore, the dosage data for a region D is overwritten on the block 1.

The writing operation is sequentially processed by the following procedure every the above described region of 1 mm in width.

The pattern data for the data stripes 1 and 2 are transferred from the control computer 37 to the buffer memory 165 to be stored therein. The shot dividing circuit 166 extracts pattern data corresponding to the above described region of 1 mm in width from the pattern data for the data stripes 1 and 2 to divide the extracted pattern data into data having a size corresponding to one shot, and calculates the central position of the pattern data of each shot. Then, the dosage selecting circuit 167 extracts dosage data corresponding to the pattern data of each shot, specifically dosage data including the central position of each shot, from the dosage data of the mesh stored in the cash memory 164, sets the selected dosage data as set dosage data of the shot and supplies the set dosage data to the irradiation time calculating circuit 168. The irradiation time calculating circuit 168 calculates an irradiation time for each shot by a procedure which will be described later, and the resulting data are supplied to various control circuit part 170 via the control circuit 160 to write a pattern on the reticle every shot.

Referring to the flow charts of FIGS. 21 and 22, the operation of the charged beam lithography system 9 will be described in detail below.

Figure 21:
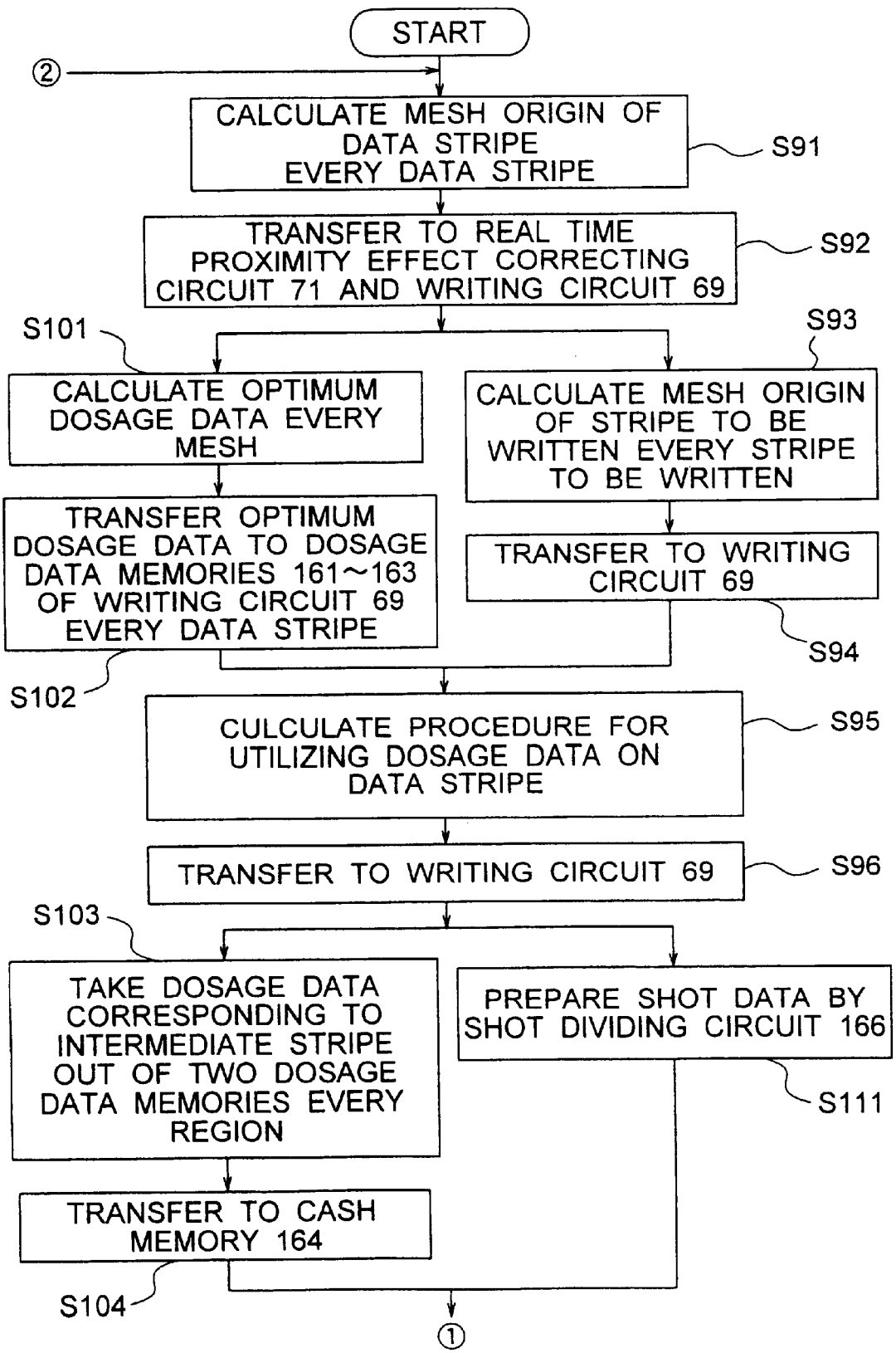
FIGS. 21 and 22 are flowcharts for explaining the operation of the charged beam lithography system shown in FIG. 14.

First, as shown in FIG. 21, the control computer 37 calculates a reference position (which will be hereinafter referred to as a "mesh origin") for identifying a two-dimensional layout of meshes in each data stripe (step S91), to supply dosage data, together with mesh origin data, to the real time proximity effect correcting circuit 71 and the writing circuit 69 (step S92).

The real time proximity effect correcting circuit 71 receives these data to calculate optimum dosage data every mesh on the basis of the previously supplied pattern data (step S101). That is, the real time proximity effect correcting circuit 71 divides the pattern in the stripe into meshes to derive the area of each mesh, and executes a convolution calculation on the basis of the derived area to utilize the calculated value to calculate dosage data every mesh. By setting a mesh boundary on the basis of the mesh origin of each stripe, which has been previously transferred from the control computer 37, using the following formulae (3) and (4), the continuity of dosage mesh can be ensured.

$x$-Coordinate of Mesh Boundary=Mesh Origin $x_1$ of the Stripe from Chip Origin+($x$-Direction Size $X$ of Mesh)×n  (3)

$y$-Coordinate of Mesh Boundary=Mesh Origin $Y_1$ of the Stripe from Chip Origin+($y$-Direction Size $Y$ of Mesh)×m  (4)

Figures 23, 24:
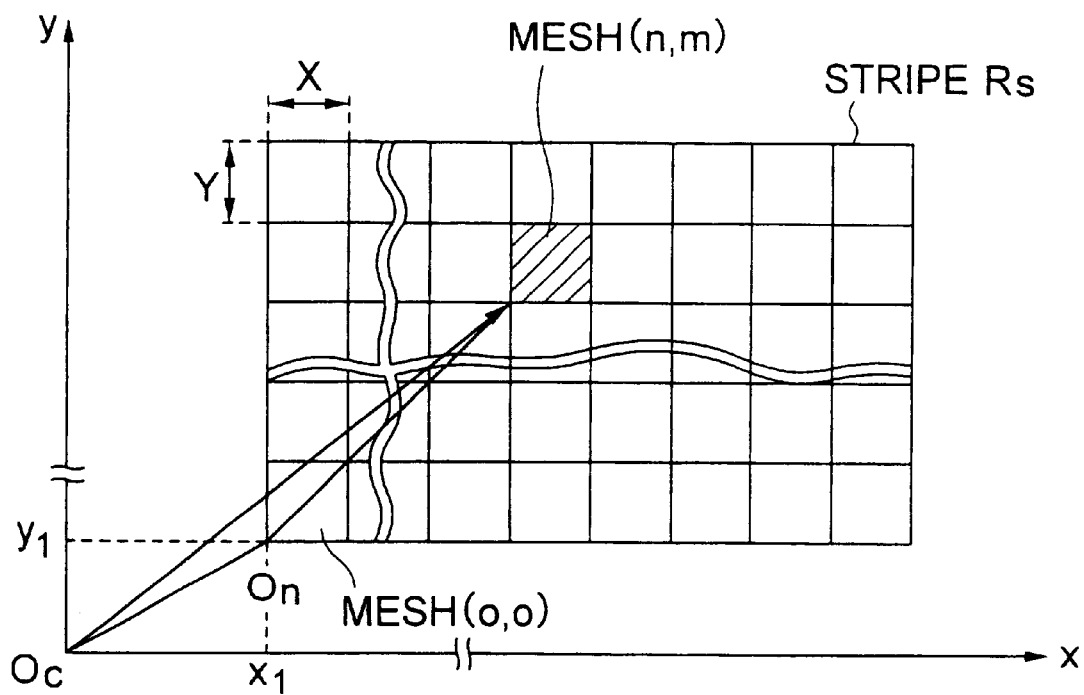
FIG. 23 is a schematic diagram for explaining a method for setting a mesh boundary.
FIG. 24 is a schematic diagram for explaining dosage data stored in a dosage data memory of the writing circuit shown in FIG. 17.

In the above-described formulae, n and m are numbers for identifying a mesh. For example, as shown in FIG. 23, in the two-dimensional coordinates having the chip origin of $O_c$, the coordinates of the mesh origin $O_n$ of the stripe $R_s$ are $(x_1, Y_1)$, and the mesh size shown in the figure is X x Y, so that the coordinates of the mesh boundary of a mesh (n, m) which is number n from the mesh origin in x direction and number m from the mesh origin in y direction are $(x_1+Xn, Y_1+Ym)$.

Referring to FIG. 21 again, the real time proximity effect correcting circuit 71 calculates the optimum dosage data for one stripe as described above to store the calculated results in the buffer memory 181 (see FIG. 17), and then, transfers the stored results to the dosage data memories 161 through 163 of the writing circuit 69 (step S102).

While the optimum dosage data are calculated by the real time proximity effect correcting circuit 71, the control computer 37 calculates the mesh origin of the stripe to be written every stripe to be written (step S93). The mesh origin of a stripe to be written means a position serving as a reference for identifying the position of the stripe to be written at each number of writing in the multiple writing operation. The data of the calculated mesh origin of the stripe to be written are transferred to the writing circuit 69 (step S94).

Then, the control computer 37 calculates a procedure for utilizing dosage data on the data stripe like the procedure shown in, e.g., FIG. 20 (step S95). This is carried out every stripe to be written. The results are transferred to the writing circuit 69 (step S96).

Then, the writing circuit 69 reconstructs dosage data corresponding to a stripe to be written. For example, when the data stripe 1 of FIG. 16A is utilized as it is, to write a pattern as the stripe to be written 2 shown in FIG. 16B, the dosage data corresponding to the stripe to be written 2 may be utilized as they are, similar to the single writing operation. On the other hand, when the intermediate stripe, such as the stripe to be written 3 shown in FIG. 16B, is written, dosage data corresponding to the pattern of the intermediate stripe are taken out of the mesh data for the two data stripes 1 and 2, which have been stored in the dosage data memories 161 through 163, every region of 1 mm×1 mm (step S103), and the dosage data for each region are transferred to the cash memory 164 on the basis of the procedure for utilizing the mesh data, which have been previously transferred thereto, and stored therein (step S104). In the example of FIG. 16A mesh data corresponding to the data stripe 3 are transferred. In the example of FIG. 20, the dosage data for the regions A through C are stored in the blocks 1 through 3 of the cash memory 164, respectively. Furthermore, while the procedure at step S104 is executed, the writing circuit 69 is writing a pattern on the transferred region (the stripe to be written in the example of FIG. 16B) by the parallel processing, and the real time proximity effect correcting circuit 71 is calculating optimum dosage data corresponding to the next data stripe to be transferred (the data stripe 4 in the example of FIG. 16A).

Figure 25:
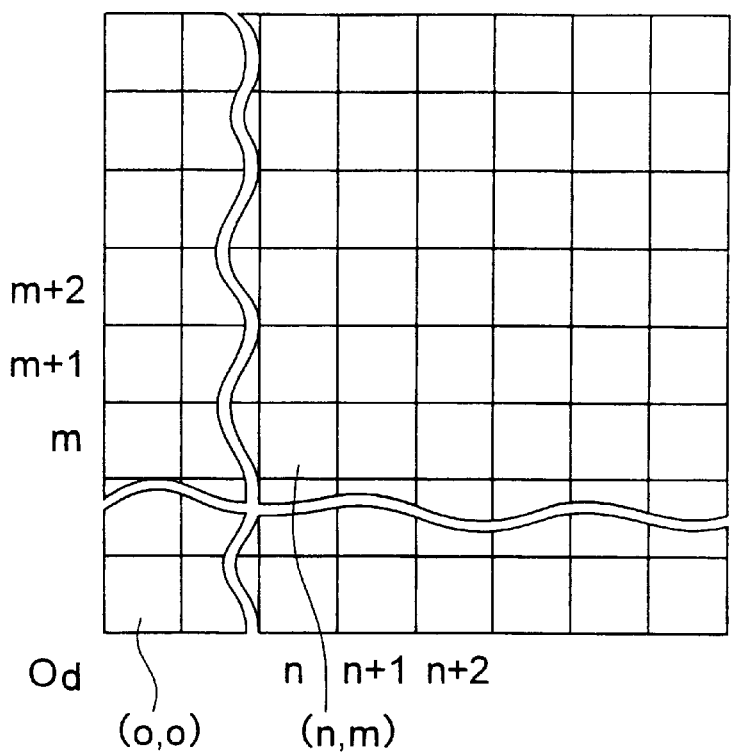
FIG. 25 is a schematic diagram showing the two-dimensional arrangement of dosage data stored in a cash memory of the writing circuit shown in FIG. 17.
Figure 26:
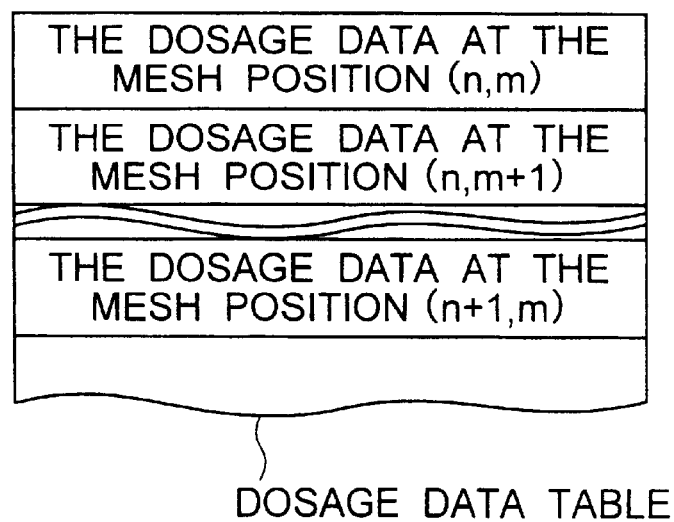
FIG. 26 is a schematic diagram for explaining a dosage data table stored in the cash memory of the writing circuit shown in FIG. 17.

The two-dimensional layout of dosage data stored in the cash memory 164 is shown in the schematic diagram of FIG. 25. For example, in this figure, the mesh position (n, m) of dosage data is a relative position when it is assumed that the mesh position at the mesh origin $O_d$ of a stripe to be written is (0, 0). The dosage data of each mesh are stored in the cash memory 164 in the form of a dosage data table as shown in FIG. 26.

Referring to FIG. 21 again, in parallel to taking out (step S103) and transferring (step S104) dosage data every the above described region, the shot dividing circuit 166 of the writing circuit 69 divides pattern data for a data stripe every shot to prepare shot data (step S111).

The optimum dosage data stored in the cash memory 164 are utilized as follows.

Figure 22:
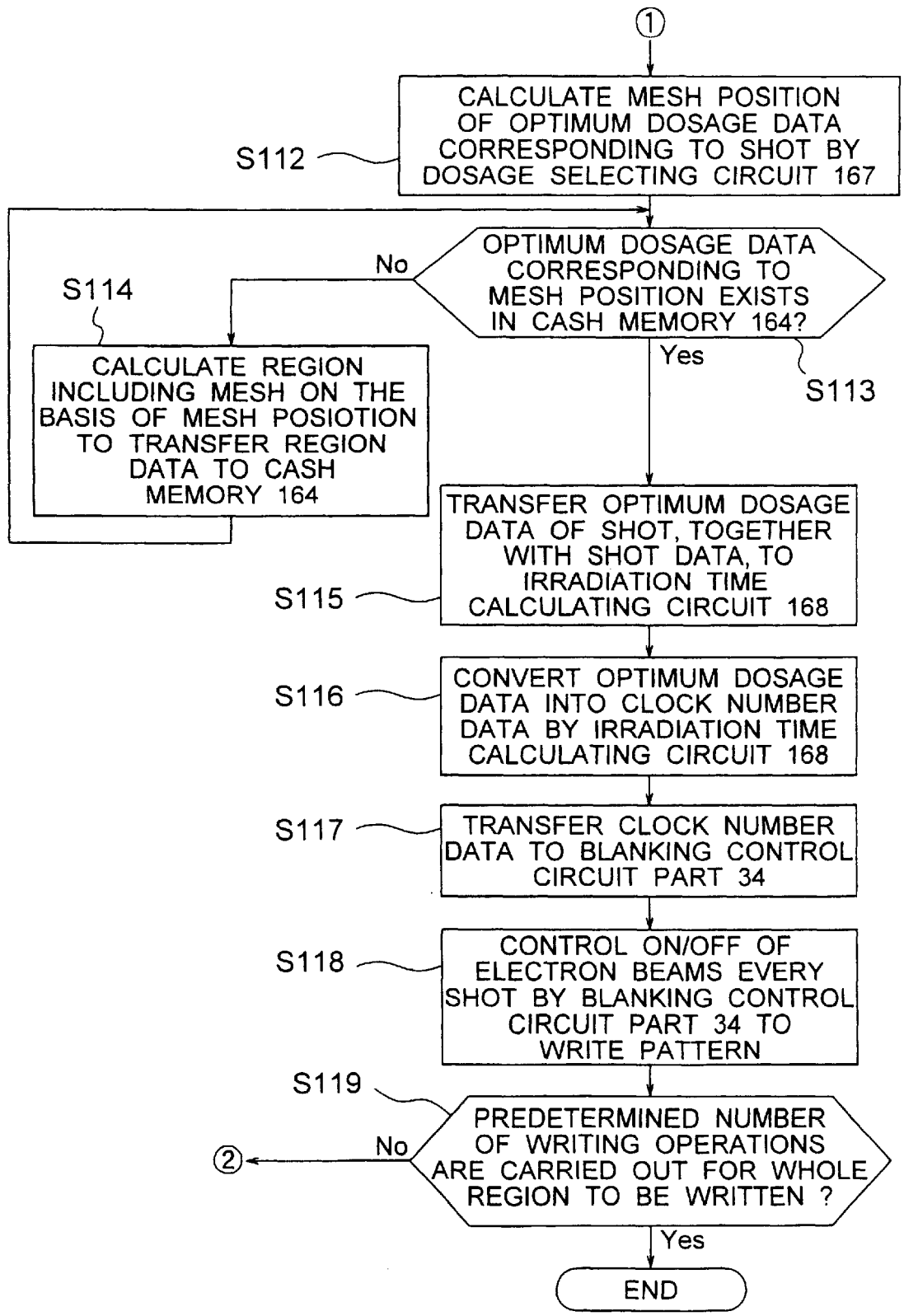

That is, as shown in FIG. 22, the dosage selecting circuit 167 calculates the mesh position (k, l) of the optimum dosage data corresponding to a certain shot in accordance with the following formulae (5) and (6) (step S112).

($k$)=Integer Part of [{($X$-Coordinate of Center of Shot) −($X$-Coordinate of Mesh Origin $O_d$ of Stripe to be written)}/($X$-Direction Size of Mesh)]  (5)

($l$)=Integer Part of [{($Y$-Coordinate of Center of Shot) ($Y$-Coordinate of Mesh Origin $O_d$ of Stripe to be written)}/($Y$-Direction Size of Mesh)]  (6)

Figure 27:
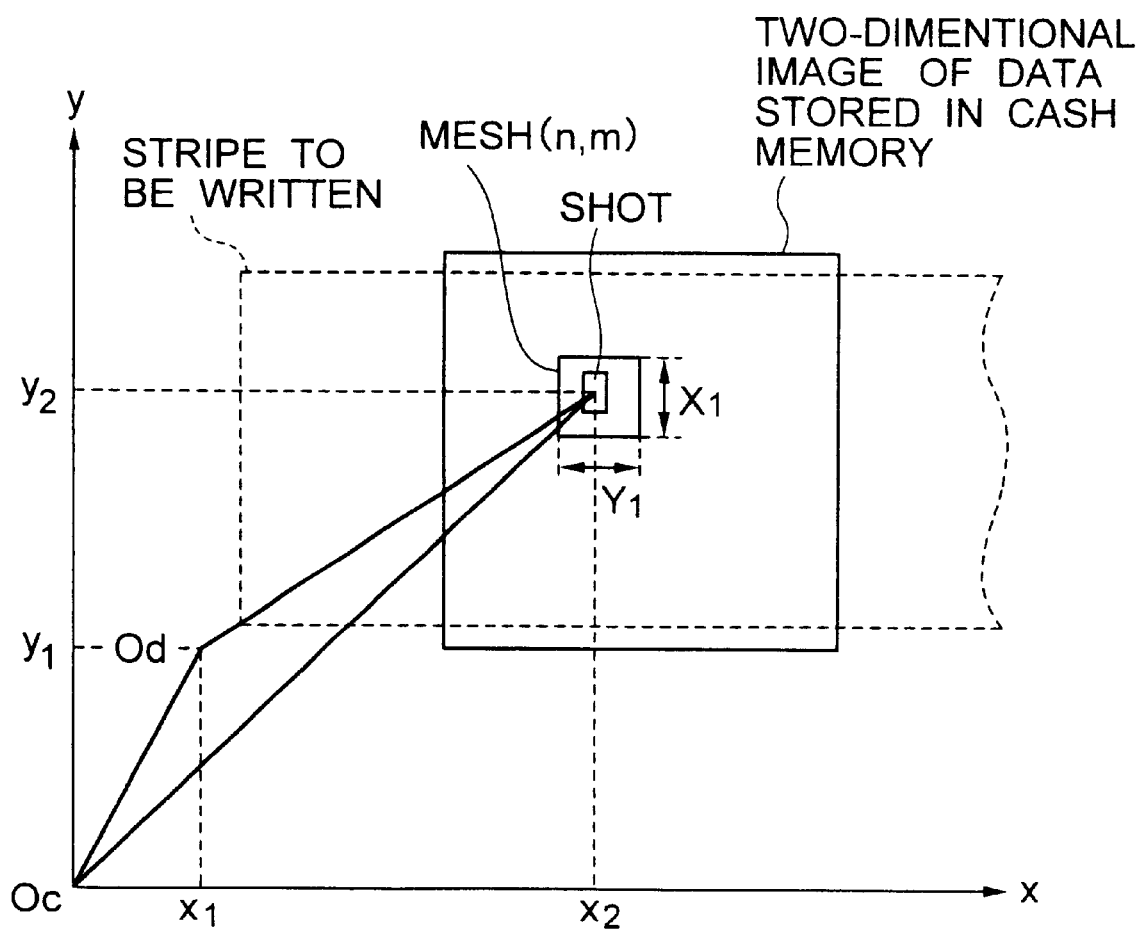
FIG. 27 is a schematic diagram for explaining a method for calculating a mesh position (k, 1) of the optimum dosage data corresponding to a shot.

An example of a shot is shown in FIG. 27. Assuming that the coordinates of the center of a shot are $(x_2, Y_2)$, the size of the shot is $X_1 \times Y_1$, and the coordinates of the mesh origin $O_d$ of a stripe to be written are $(x_1, y_1)$, then, the mesh position $(k, l)$ of the optimum dosage corresponding to the shot is as follows.

$$(k) = \text{Integer Part of } [(x_2-x_1)/X_1]$$

$$(l) = \text{Integer Part of } [(y_2-y_1)/Y_1]$$

Referring to FIG. 22 again, since the optimum dosage corresponding to the mesh at the position $(k, l)$ are dosage of the shot, the writing circuit 69 checks data in the cash memory 164 to examine whether data of the optimum dosage corresponding to the mesh position $(k, l)$ have been stored in the cash memory 164 (step S113). If the corresponding optimum dosage data have been stored (step S113), the optimum dosage data, together with the shot data thereof, are transferred to the irradiation time calculating circuit 168 (step S115). If the corresponding optimum dosage data have not been stored (step S113), the writing circuit 69 calculates a region including the mesh on the basis of the mesh position $(k, l)$, transfers data for the calculated region to the cash memory 164 (step S114) and transfers the data, together with the shot data thereof, to the irradiation time calculating circuit 168 (step S115).

The irradiation time calculating circuit 168 converts the optimum dosage data, which have been set every shot, into data concerning the number of clocks for the irradiation time (step S116). The data concerning the number of clocks are transferred to the blanking control circuit part 34 (step S117). The blanking control circuit part 34 causes beams to be turned ON/OFF by the number of clocks every shot, so that patterns are written (step S118). The number of clocks is calculated by the following formula on the basis of a reference dosage (a dosage on a portion painted out) Do designated by the user, the current density I, and the control unit Δof the irradiation time.

$$\text{Number of Clocks} = D_0 \times (\text{Dosage Data of Shot})/(\text{Current Density } I \times \text{Control Unit } \Delta) \quad (7)$$

Thus, the dosage data can be controlled every shot, so that it is possible to execute a precise dosage correction. By executing the above described procedure in the whole region every written stripe until a predetermined number of multiple writing operations are completed (step S119), both of the proximity effect correction and the multiple writing operation can be carried out in real time.

Referring to the accompanying drawings, the third preferred embodiment of a charged beam lithography system according to the present invention will be described below.

The charged beam lithography system in this preferred embodiment is characterized in that the proximity effect correction is processed by a software in real time. This software can be stored in a storage medium, such as a floppy disk or a CD-ROM, as a program executed by a computer, and can be read by a general-purpose computer to be executed. Therefore, even if the charged beam lithography system has no dedicated correcting circuit, it is possible to carry out a precise multiple writing operation in a short time while correcting the proximity effect in real time. The storage medium should not be limited to a portable medium, such as a magnetic disk or an optical disk, but the storage medium may be a fixed storage medium, such as a hard disk system or a memory. In addition, a program incorporating a series of procedures of the memory control method described below may be distributed via communication lines (including radio communications), such as Internet. Moreover, while the program incorporating a series of procedures of the memory control system described below is enciphered, modulated or compressed, the program may be distributed via a wire or radio circuit, such as Internet, or may be stored in a storage medium to be distributed.

Figure 28:
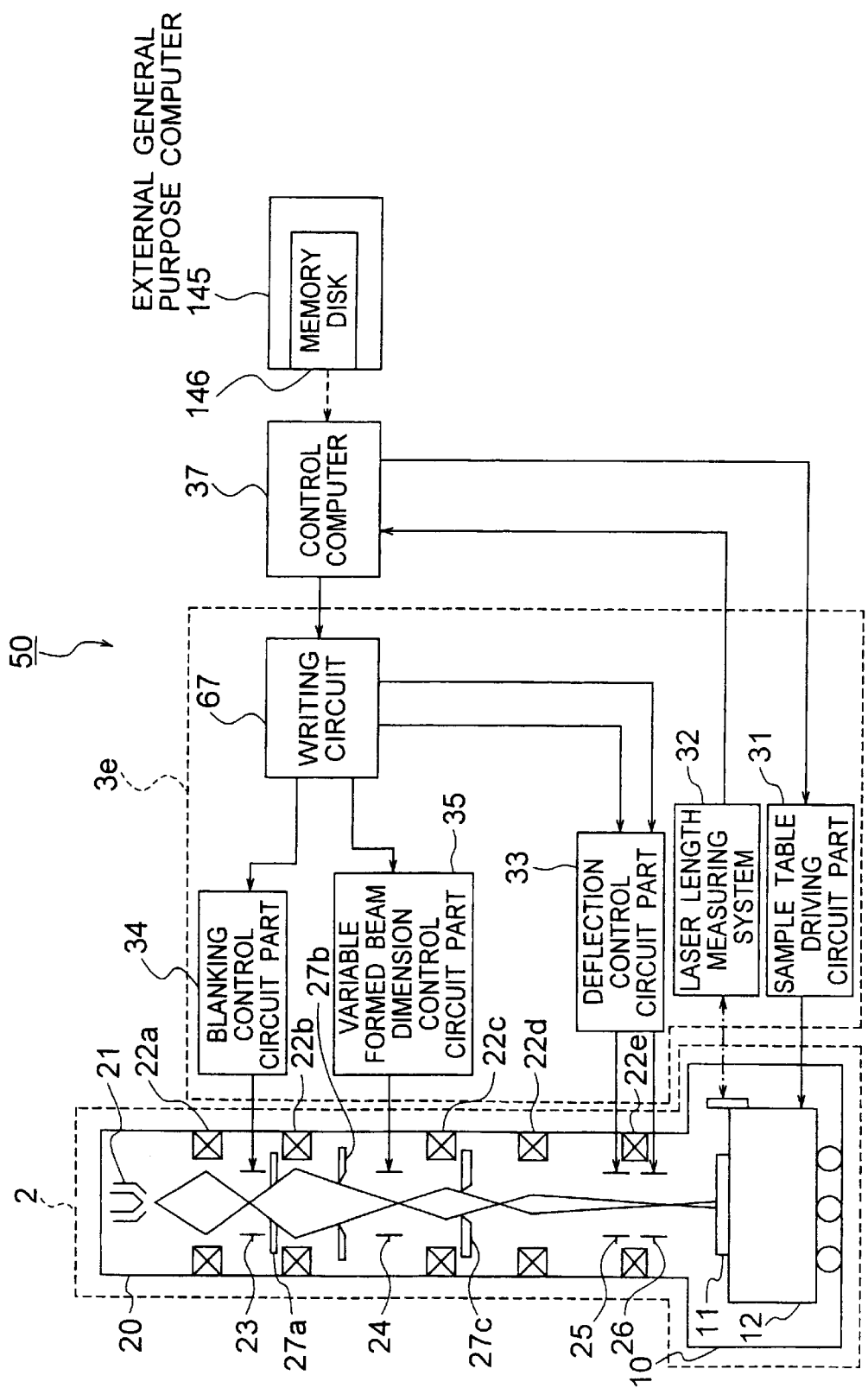
FIG. 28 is a block diagram showing the third preferred embodiment of a charged beam lithography system according to the present invention.
Figure 29:
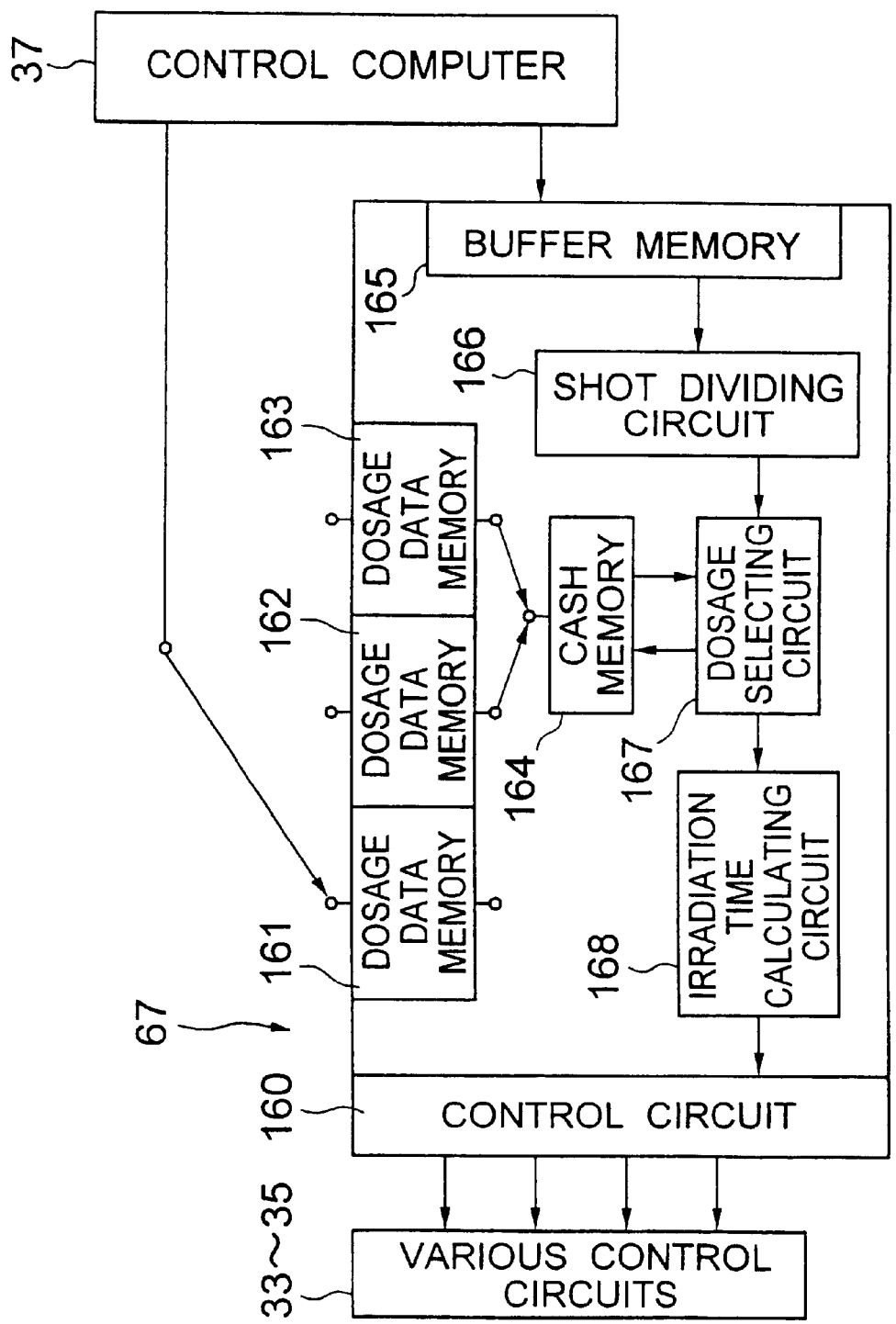
FIG. 29 is a block diagram showing the details of a writing circuit of the charged beam lithography system shown in FIG. 28.

FIG. 28 is a block diagram showing a charged beam lithography system 50 in this preferred embodiment. FIG. 29 is a block diagram showing the details of a writing circuit of the charged beam lithography system 50 shown in FIG. 28. As compared with the charged beam lithography system 9 shown in FIG. 14, the charged beam lithography system 50 shown in FIG. 28 comprises a writing circuit 67 instead of the data converting computer, the CAD system and the real time proximity effect correcting circuit. Other constructions are substantially the same as those of the charged beam lithography system 9.

Figure 30:
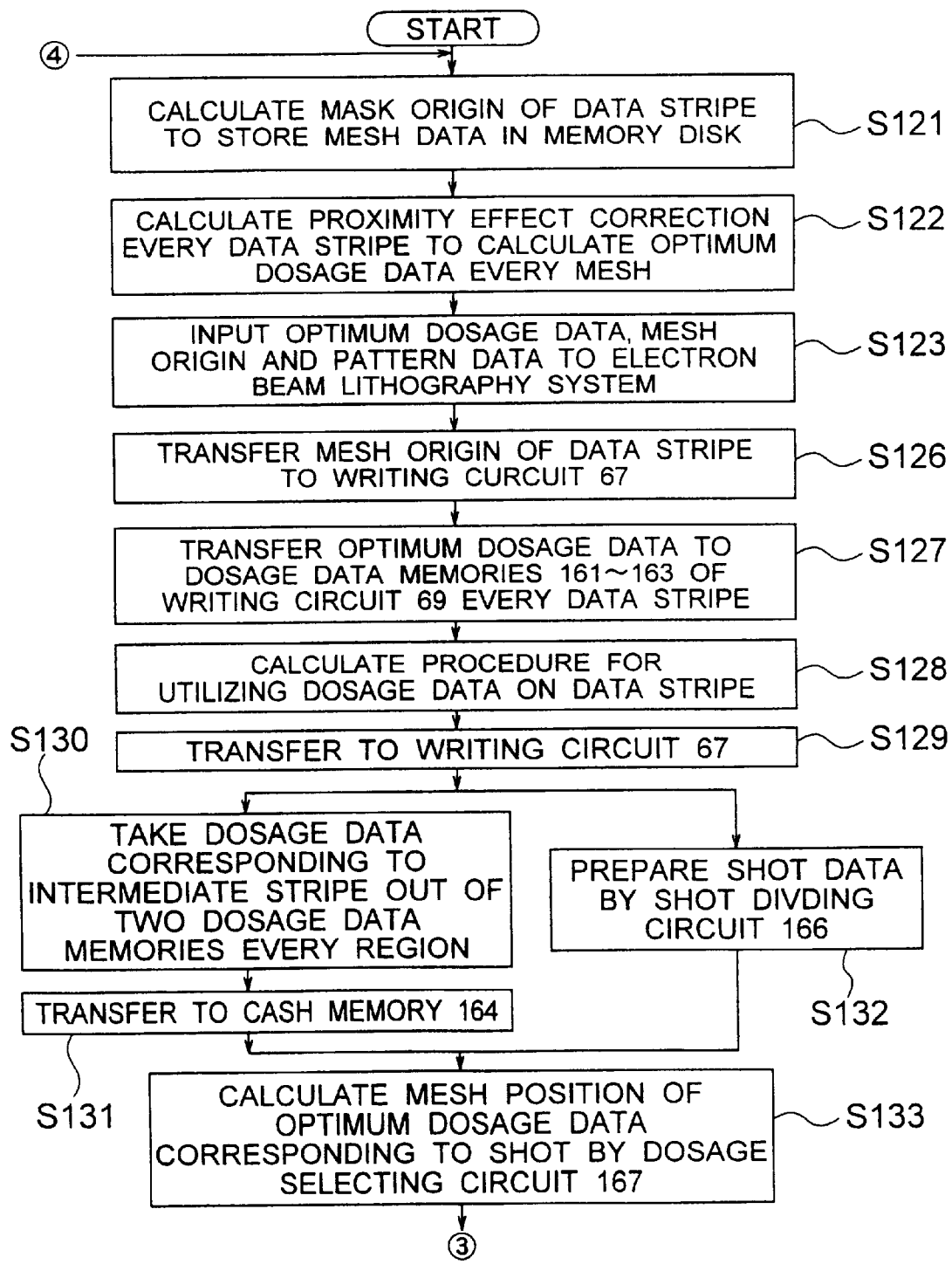
FIGS. 30 and 31 are flowcharts for explaining the operation of the charged beam lithography system shown in FIG. 28.
Figure 31:
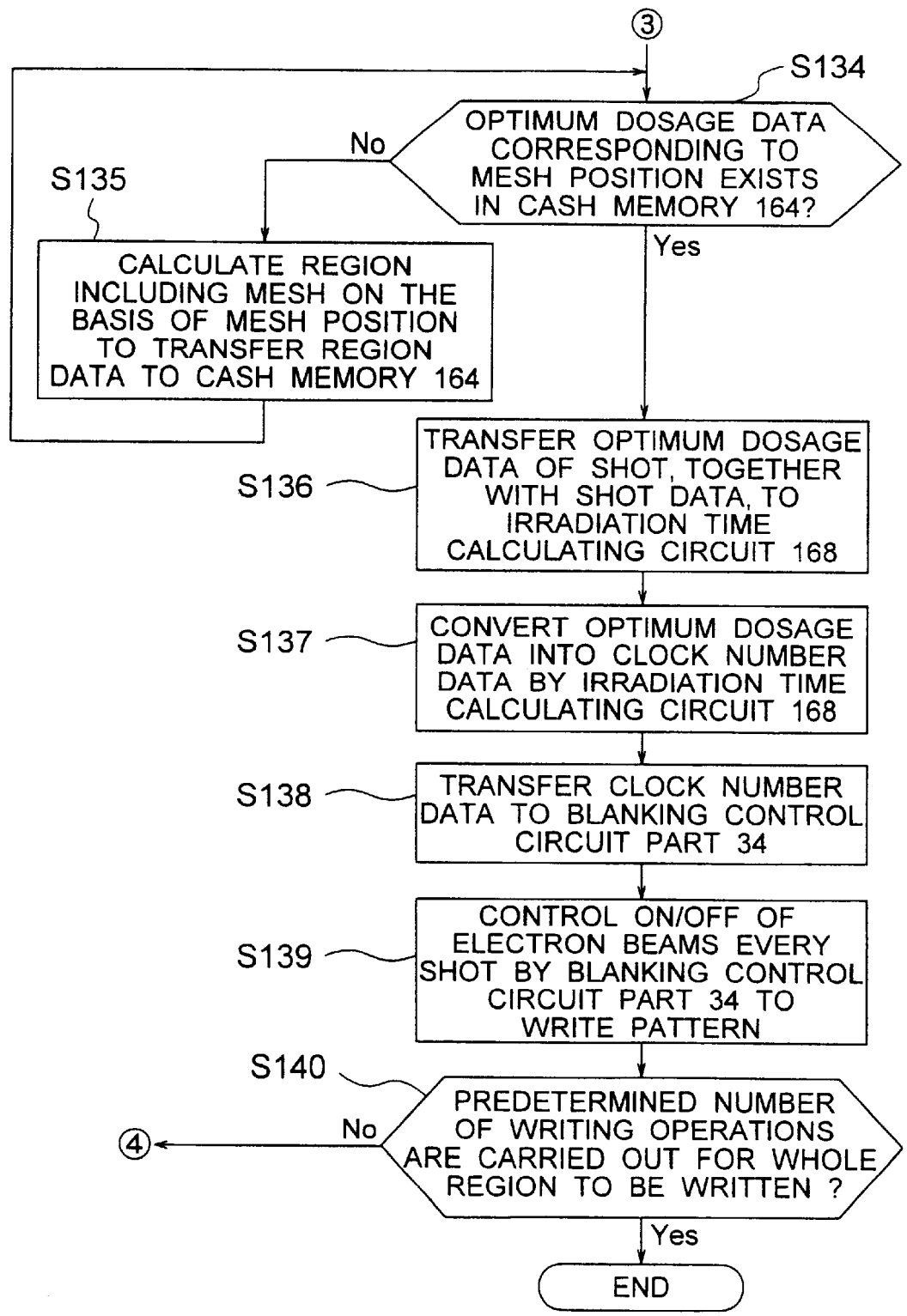

FIGS. 30 and 31 are flowcharts for explaining the operation of the charged beam lithography system 50 in this preferred embodiment.

As shown in FIG. 30, an external general purpose computer 145 (see FIG. 28) is used to calculate mesh origins of data stripes every data stripe to store the calculated mesh origins in a memory disk 146 (see FIG. 28) (step S121). In addition, on the basis of the mesh origins of the data stripes, the calculation for correction taking account of the influence of the proximity effect is carried out every data stripe to calculate an optimum dosage every mesh to store the calculated optimum dosage of each mesh, together with the mesh origin of each data stripe, in the memory disk 146 (step S122).

Then, the optimum dosage data of each mesh and the mesh origin data of each data stripe, together with the pattern data, are inputted from the memory disk 146 of the general purpose computer 145 to the charged beam lithography system 50 (step S123). By means of a control software, the mesh origin of each stripe to be written during the multiple writing operation are calculated from the data of the stripe origin described on the pattern data and the data of the mesh origin (step S125) and these data are transferred to the writing circuit 67 (step S126). In addition, the optimum dosage data are transferred to the dosage data memories 161 through 163 of the writing circuit 67 every data stripe (step S127).

Moreover, the control computer 37 calculates a procedure for utilizing dosage data on the data stripe (step S128). This is carried out every stripe to be written. The results thereof are transferred to the writing circuit 67 (step S129).

The processing procedure after this is substantially the same as the operation of the charged beam lithography system 9 shown in FIG. 14.

That is, the writing circuit 67 reconstructs dosage data corresponding to stripes to be written. When one data stripe is utilized as it is, to write a pattern, the dosage data corresponding to the data stripe is utilized as it is, similar to the single writing operation. On the other hand, when an intermediate stripe is written, dosage data corresponding to the pattern of the intermediate stripe are extracted from the mesh data for two data stripes, which have been stored in the dosage data memories 161 through 163, every region of 1 mm×1 mm (step S130), and the dosage data for each region are transferred to the cash memory 164 on the basis of the procedure for utilizing the mesh data, which have been previously transferred at step S128, to be stored therein (step S131). In parallel to the extraction (step S130) and transfer (step S131) of the dosage data, the shot dividing circuit 166 of the writing circuit 67 divides pattern data for the data stripe every shot to prepare shot data (step S132). Furthermore, in parallel to the transfer procedure at step S131, a processing for writing a region having been transferred, and a processing for calculating optimum dosage data on the next data stripe to be transferred are carried out. The optimum dosage data stored in the cash memory 164 are utilized as follows. That is, the dosage selecting circuit 167 calculates the mesh position (k, l) of the optimum dosage data corresponding to a certain shot, in accordance with the above described formulae (5) and (6) (step S133). Then, as shown in FIG. 31, the writing circuit 67 checks data in the cash memory 164 to examine whether optimum dosage data corresponding to the mesh position have been stored in the cash memory 164 (step S134). When the corresponding optimum dosage data have been stored (step S134), the corresponding optimum dosage data, together with the shot data thereof, are transferred to the irradiation time calculating circuit 168 (step S136). On the other hand, when the corresponding optimum dosage data have not been stored (step S134), a region including the mesh is calculated on the basis of the mesh position (k, l), and the calculated data are transferred to the cash memory 164 (step S135). Then, the calculated data, together with the shot data thereof, are transferred to the irradiation time calculating circuit 168 (step S136).

Then, the irradiation time calculating circuit 168 converts the optimum dosage data, which have been set every shot, into data concerning the number of clocks for the irradiation time (step S137), to transfer the data concerning the number of clocks to the blanking control circuit 34 (step S138). Then, the blanking control circuit 34 causes a beam to be turned ON/OFF by the number of clocks every shot, so that a pattern is written (step S139). By executing the above described procedure on the whole region every stripe to be written until a predetermined number of multiple writing operations are completed (step S140), both of the proximity effect correction and the multiple writing operation can be carried out.

The difference between the operation of the charged beam lithography system 50 in this preferred embodiment and the operation of the above described electron beam lithography system 9 is only that output data are result from the memory disk 146 in place of the real time processing circuit. That is, the optimum dosage data are transferred from the memory disk 146 to the dosage data memories 161 through 163 of the writing circuit 67 without providing the real time proximity effect correcting circuit. The control computer 37 to be executed can control this.

Thus, according to the charged beam lithography system 50 in this preferred embodiment, it is not required to have prepared the proximity effect correction data every intermediate stripe during the multiple writing, so that it is possible to realize a precise writing operation while shortening the processing time in the whole system. In the above described third preferred embodiment, the calculation for correction is processed every data stripe by utilizing the control software, and the calculation of the dosage data for the intermediate stripe based on the data is processed by means of the charged beam lithography system 50. However, the dosage data for the intermediate stripe to be written may be processed by a correction software in accordance with the above-described procedure. That is, the calculation for correction itself may be carried out every data stripe, and the calculation of the dosage data for the intermediate stripe to be written may be executed by the taking out and combining the dosage data for adjacent stripes to transfer the results thereof to the electron beam lithography system 50. In this case, since the transfer of the dosage data is carried out from the memory disk 146 to the writing circuit 67 by the number of stripes to be written, there is a problem in that the loss time in the data transfer occurs. However, this problem can also be solved by using high-speed transfer means or a high-speed accessible memory disk (e.g.RAM disk).

As compared with the prior art, the above-described effects of the present invention about the proximity effect correction time will be described below.

Similarly with respect to both of the data stripe and the stripe to be written, the time required for one shot to carry out a single writing operation (which will be hereinafter referred to as a "shot time") is converted from the dosage to be assumed to be, e.g., 1 $\mu$m. The shot time to carry out a multiple writing operation on the same dosage conditions is 0.5 $\mu$m in the case of the double writing operation and 0.25 $\mu$m in the case of the quadruple writing operation.

In addition, it is assumed that the writing time for writing the whole region of one stripe is 1.3 s in total in the case of the single writing operation, assuming that the total time required for a shot is 1 s and the time added by a predetermined quantity regardless of dosage is 0.3 s. Similarly, it is assumed that the writing time in the double writing operation is 0.8 s, and the writing time in the quadruple writing operation is 0.55 s.

On the other hand, the time required for the proximity effect correction for one stripe (which will be hereinafter referred to as a "correction time") must be shorter than the writing time in order to process corrections in real time in parallel to the writing processing. Therefore, it is assumed that the correction time is, e.g., 1 s. With respect to three cases of the single, double and quadruple writing operations in such assumption, the correction times in the prior art and the present invention were calculated. The calculated results are shown in Table 1.

TABLE 1

|  | Writing Time | Correction Time In The Prior Art | Correction Time In The Invention |
| --- | --- | --- | --- |
| Single Writing | 1.3 s | 1 s | 1 s |
| Double Writing | 1.6 s (0.8 s × 2) | 2 s (1 s × 2) | 1 s |
| Quadruple Writing | 2.2 s (0.55 s × 4) | 4 s (1 s × 4) | 1 s |

As shown in Table 1, according to the prior art, the correction times in the cases of the double writing operation and quadruple writing operation are long, so that it is required to wait for the writing processing. This is because a number of stripes to be written in proportion to the multiplicity are written on one data stripe in the multiple writing operation as described above. Conventionally, this problem must be solved by improving the processing speed of the proximity effect correcting circuit, but it is difficult to realize such a circuit with a simple construction.

On the other hand, the above described second and third preferred embodiments of a charged beam lithography system according to the present invention take the account of the influence of the proximity effect on only the data stripe for the single writing operation, to correct the dosage to calculate the optimum dosage, and takes out and combines the optimum dosage data to cope with the intermediate stripe during the multiple writing operation, so that the correction time remains being 1 s even if the multiplicity increases as shown in Table 1. Therefore, it is not required to wait for the writing operation.

Thus, according to the present invention, it is possible to process the proximity effect correction corresponding to the multiple writing operation at the same processing speed as that in the case of the single writing operation, without being influenced by the multiplicity of the writing operation. Thus, it is possible to cope with both the proximity effect correction and the multiple writing operation to precisely and rapidly write patterns.

Referring to the accompanying drawings, the fourth preferred embodiment of a charged beam lithography system according to the present invention will be described below.

Figure 32:
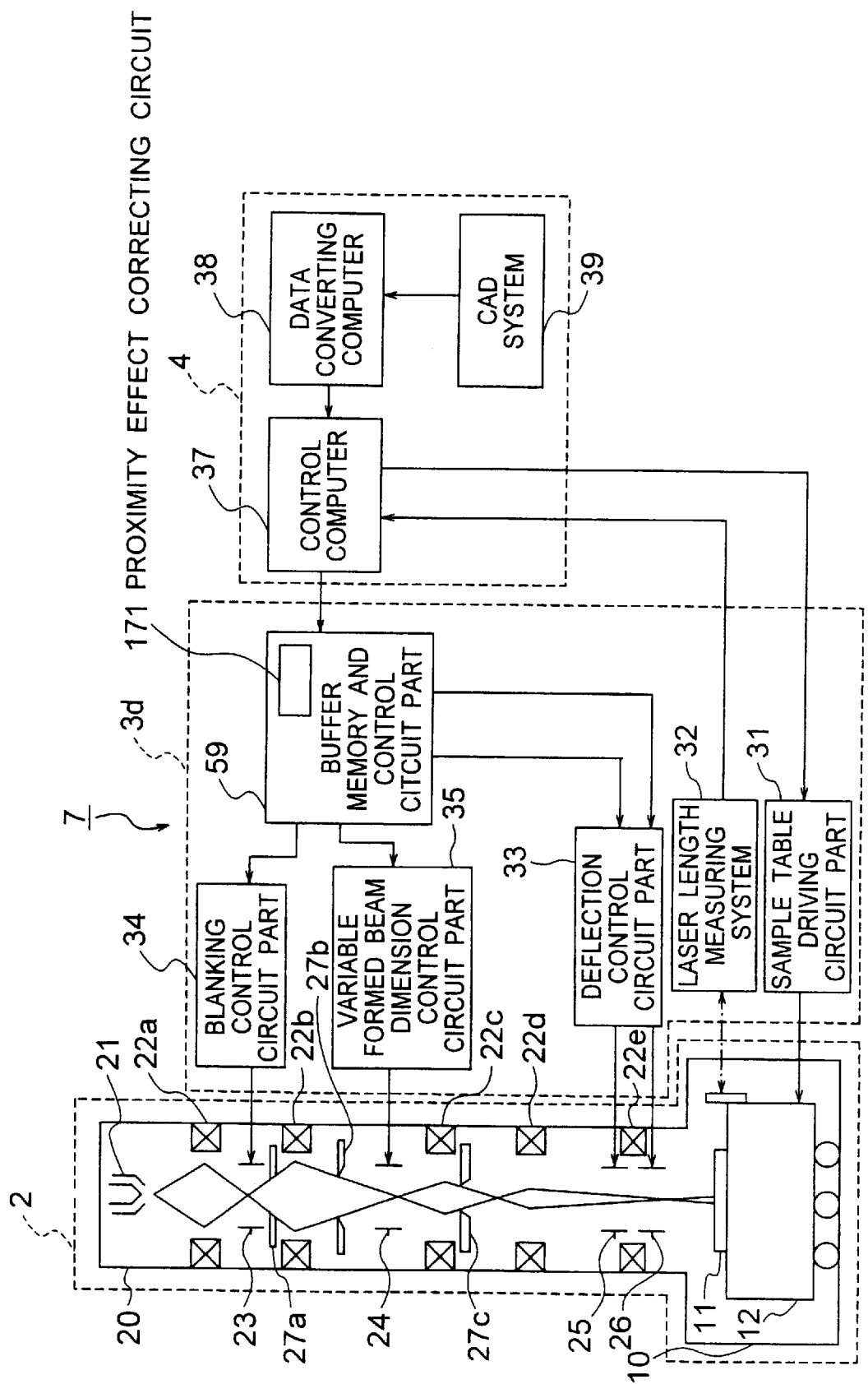
FIG. 32 is a block diagram showing the fourth preferred embodiment of a charged beam lithography system according to the present invention.

FIG. 32 is a block diagram showing a charged beam lithography system in this preferred embodiment. As compared with the charged beam lithography system 9 shown in FIG. 14, the charged beam lithography system 7 in this preferred embodiment is characterized in that a buffer memory and control circuit part 59 is provided in place of the real time proximity effect correcting circuit and writing circuit 66. The buffer memory and control circuit part 59 includes a proximity effect correcting circuit part 171 which is one of the features of this preferred embodiment. Other constructions are substantially the same as those of the charged beam lithography system 9 shown in FIG. 14. Furthermore, a sub-deflecting system 26 of an electron optics system 2 controls the beam position within a sub-deflecting region of about 60 $\mu$m×60 $\mu$m (sub-field: see FIG. 2).

Figure 33:
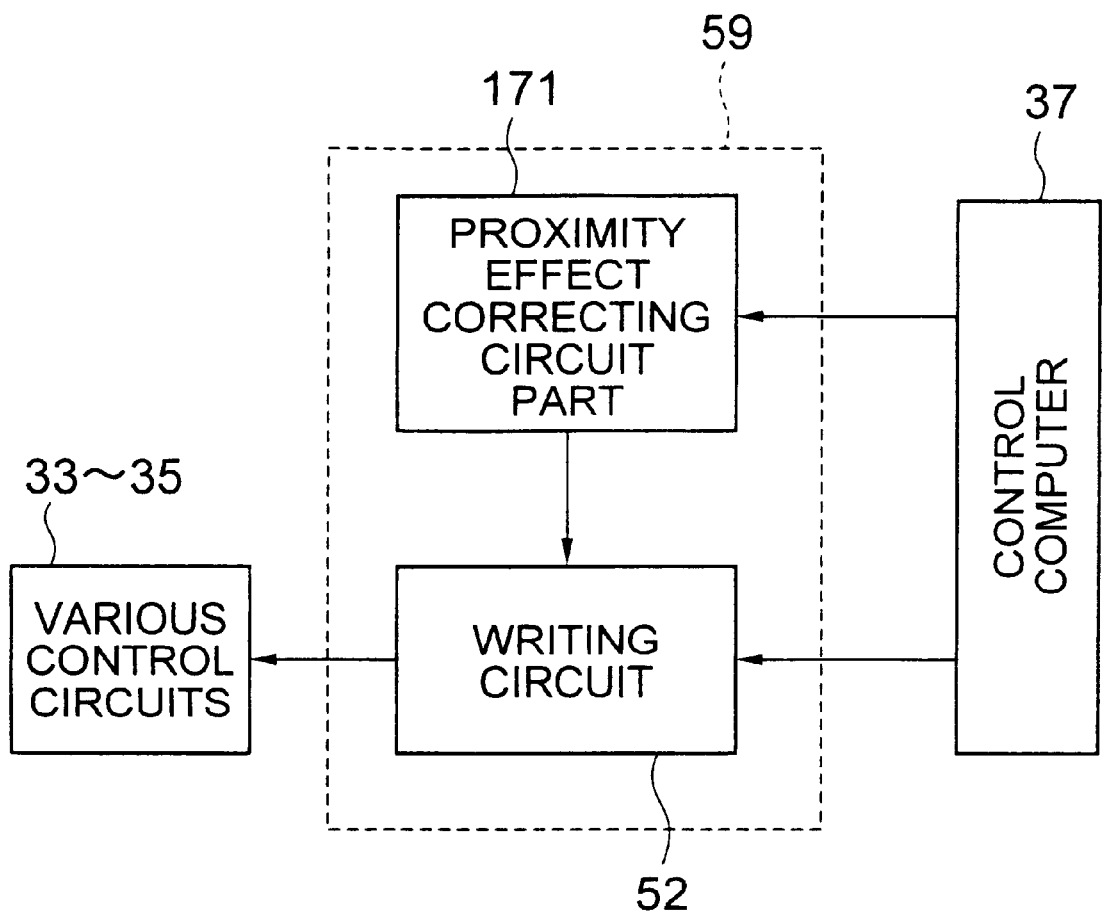
FIG. 33 is a block diagram showing the details of a buffer memory and a control circuit part of the charged beam lithography system shown in FIG. 32.

The detailed construction of the buffer memory and control circuit part 59 is shown in the block diagram of FIG. 33. As shown in this figure, the buffer memory and control circuit part 59 includes the proximity effect correcting circuit part 171 and writing circuit 52. The proximity effect correcting circuit part 171 receives pattern data and dosage data from the control computer 37 to take account of the influence of the proximity effect to correct dosages. The writing circuit 52 receives the results calculated by the proximity effect correcting circuit part 171, and the pattern layout information supplied from the control computer 37 to prepare writing data to supply the prepared writing data to various control circuit parts 33 through 35, e.g. a deflection control circuit part 33.

Figure 34:
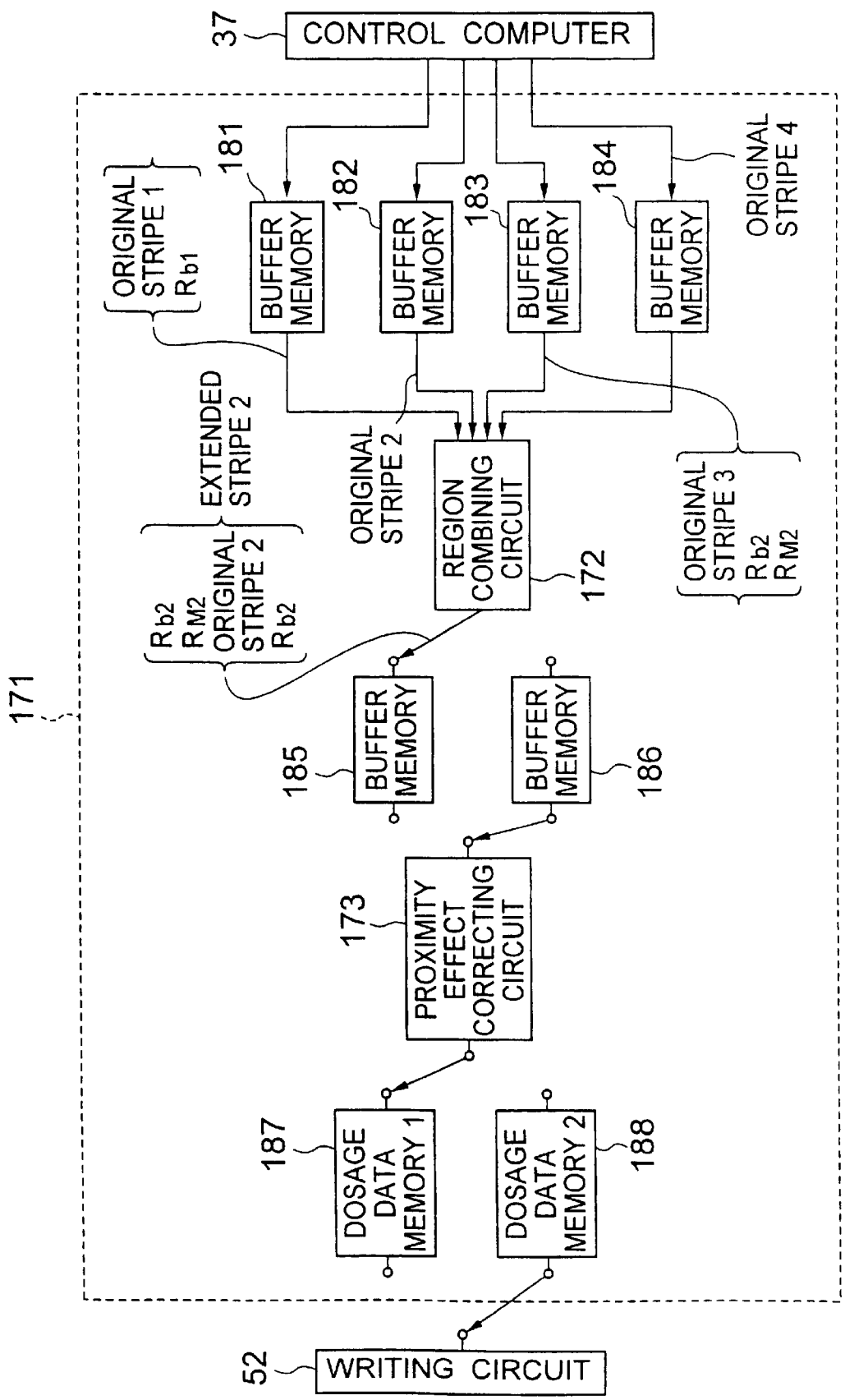
FIG. 34 is a block diagram showing the details of a proximity effect circuit part of the charged beam lithography system shown in FIG. 32.

FIG. 34 is a block diagram showing the details of the proximity effect correcting circuit part 171. As shown in this figure, the proximity effect correcting circuit part 171 comprises buffer memories 181 through 186 for storing pattern data, a region combining circuit 172 for carrying out a region combining processing, which will be described later, between pattern data, a proximity effect correcting circuit 173, and dosage data memories 187 and 188. Both of the input and output of the proximity effect correcting circuit 173 adopt the double bank system, so that the proximity effect correcting circuit 173 can process input, calculation and output in parallel by the pipeline system.

Figure 35:
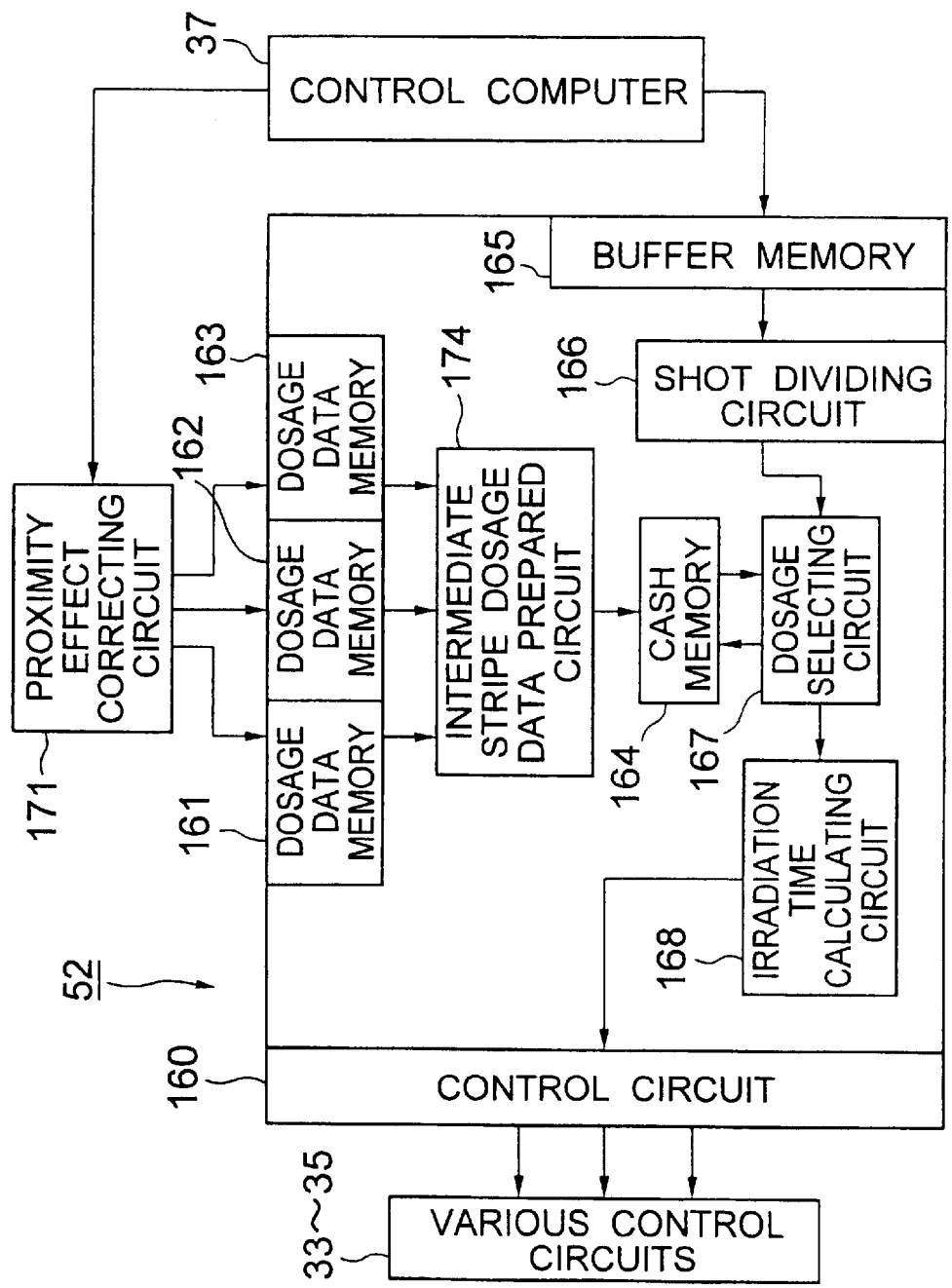
FIG. 35 is a block diagram showing the details of a writing circuit of the charged beam lithography system shown in FIG. 32.

FIG. 35 is a block diagram showing the details of the writing circuit 52. As can be clearly seen from the comparison with FIG. 29, the writing circuit 52 shown in this figure has an intermediate stripe dosage data preparing circuit 174, which is provided between dosage data memories 161 through 163 and a cash memory 164 and which is one of the features of this preferred embodiment. Other constructions are substantially the same as those of the writing circuit 67 shown in FIG. 29.

With this construction, the operation of the charged beam lithography system 7 will be described below.

The first feature of the operation of the charged beam lithography system 7 in this preferred embodiment is that an extended stripe (corresponding to a second stripe, which will be hereinafter referred to as an "extended stripe") is prepared by adding a margin region serving as a predetermined auxiliary region and a backward scattering region to the original stripe (corresponding to a first stripe, which will be hereinafter referred to as the "original stripe"), to calculate the proximity effect correction on the basis thereof. The second feature of the operation of the charged beam lithography system 7 is that the intermediate stripe is prepared by removing the overlap from the corrected dosage data calculated by the above-described method.

Figure 36:
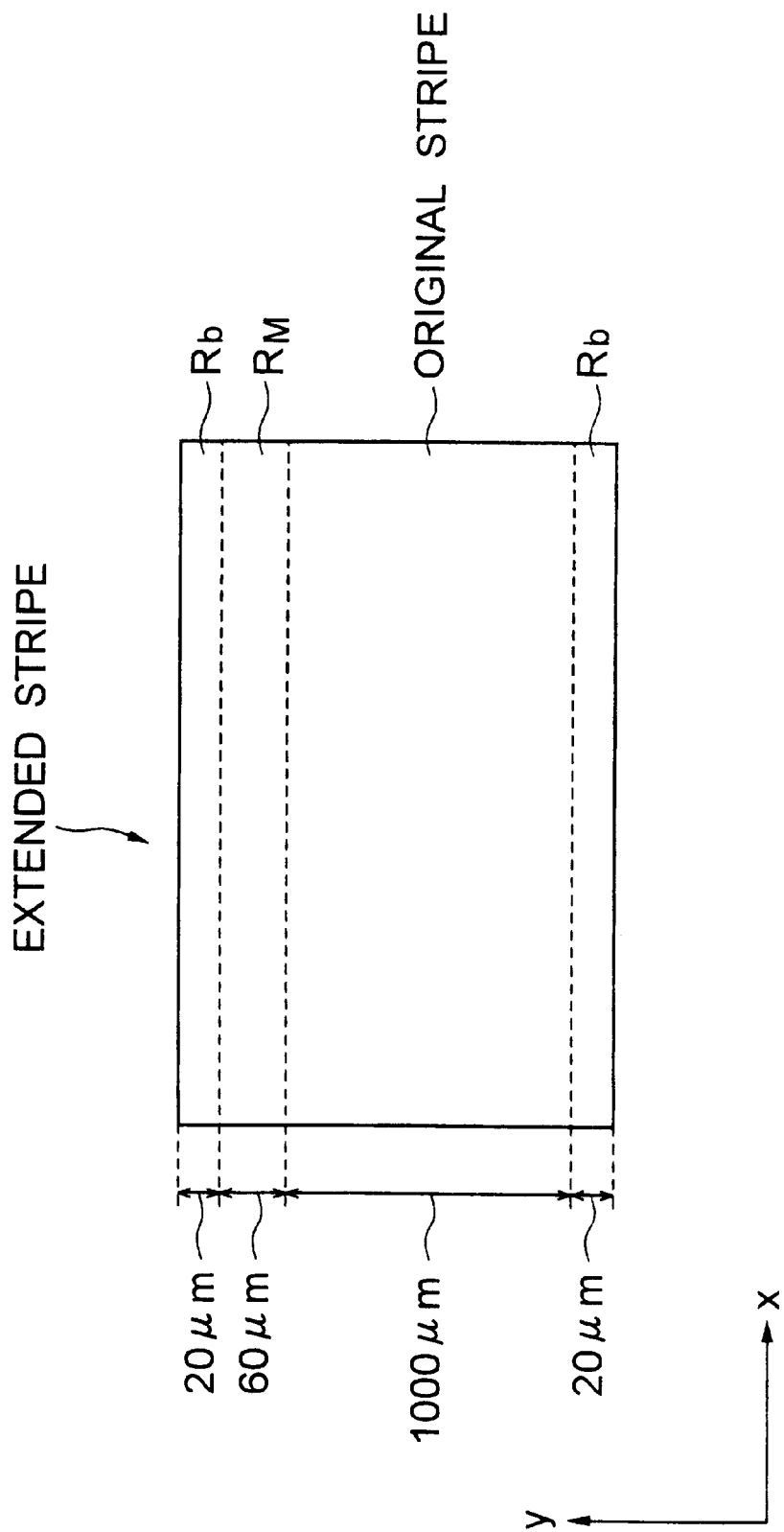
FIGS. 36 through 39 are schematic diagrams for explaining an extended stripe serving as a second stripe.

First, referring to FIGS. 36 through 38, the above-described extended stripe will be described. As shown in FIG. 36, the extended stripe is prepared by adding a margin region $R_M$ to the original stripe and adding a backward scattering region $R_b$ to outside of the original stripe and the margin region $R_M$ in the vertical directions thereof. The margin region $R_M$ means a rectangular region which has the same height as that of one sub-field in the vertical directions (y directions) of a stripe, and the same length as that of the stripe in the lateral directions (x directions). In addition, the backward scattering region $R_b$ means a region for avoiding the influence of backward scattered electrons. The margin region $R_M$ is an auxiliary region for causing the whole region of a protruding pattern to belong to any one of stripes without dividing the protruding pattern. Assuming that the backward scattering range is $\sigma$, the height of the backward scattering region $R_b$ is $2\sigma$. In this preferred embodiment, $\sigma=10 \mu$m since the acceleration voltage of electron beams is 50 kV as described above. As described above, the region obtained by adding the margin region $R_M$ and the two backward scattering regions $R_b$ to the original stripe is defined as the extended stripe, and the pattern is divided by the extended region to carry out the proximity effect correction.

Using the protruding pattern 151 shown in FIG. 2, a method for dividing pattern data on the basis of such an extended stripe will be described. In this preferred embodiment, when the whole region of the sub-field is contained in a certain extended stripe, it is assumed that the sub-field belongs to the extended stripe, and when a part of the sub-field exists in a region of adjacent extended stripes, it is assumed that the sub-field belongs to the adjacent extended stripes.

Figure 1:
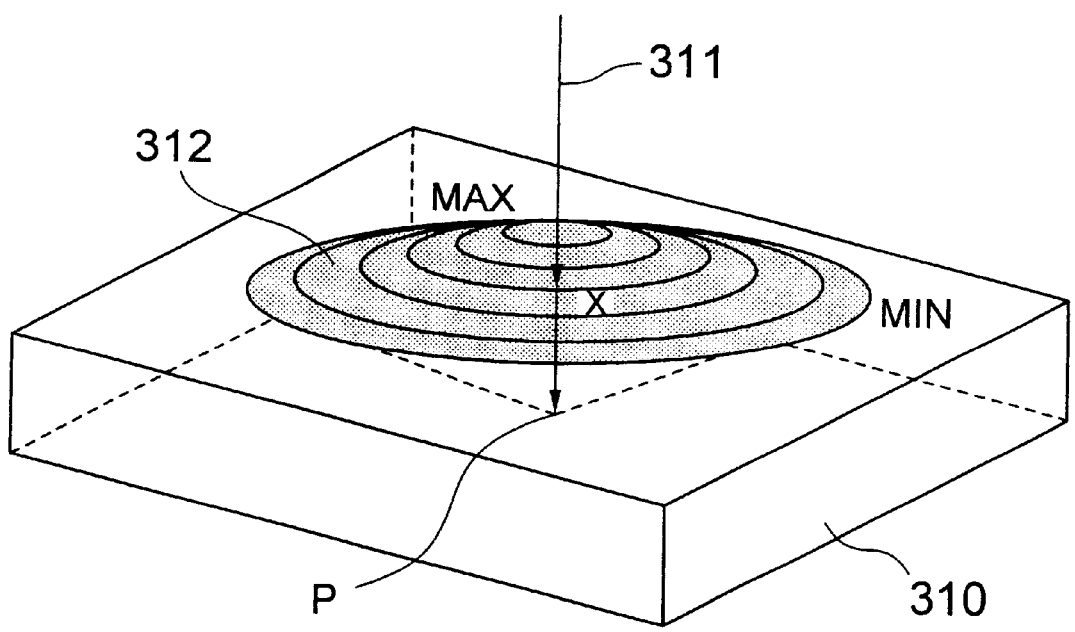
FIG. 1 is a schematic diagram for explaining the proximity effect.
Figure 2:
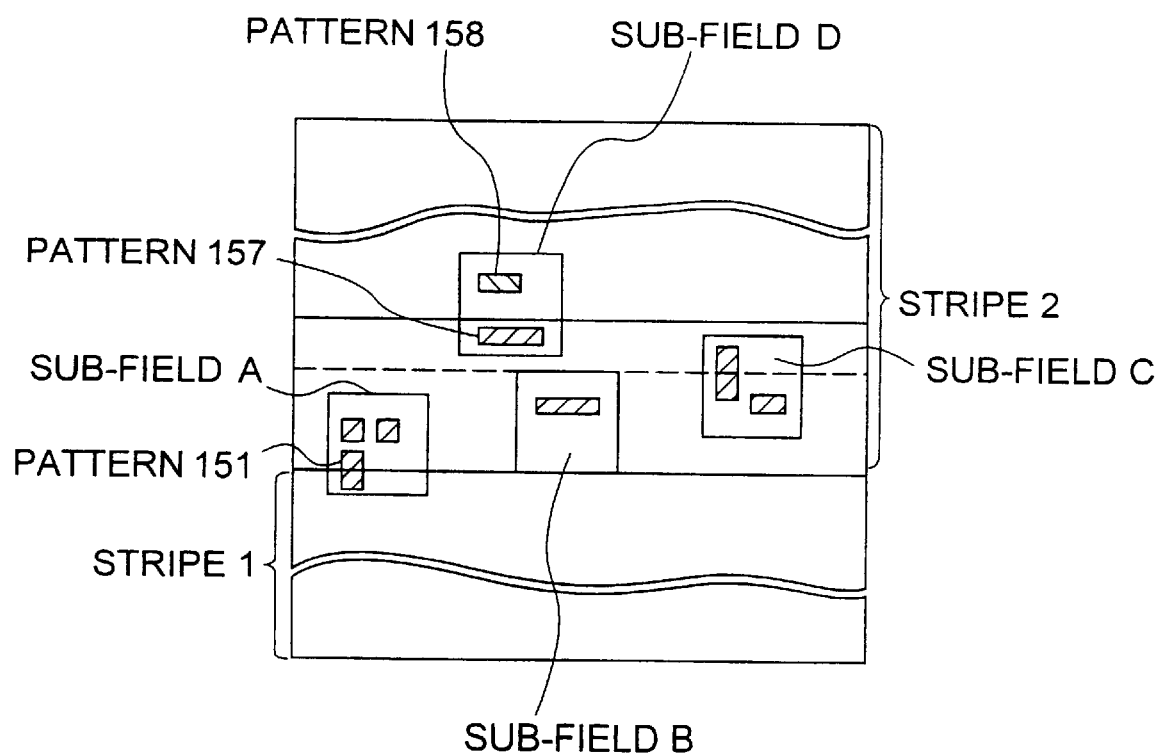
FIG. 2 is a pattern diagram for explaining the prior art.
Figure 37:
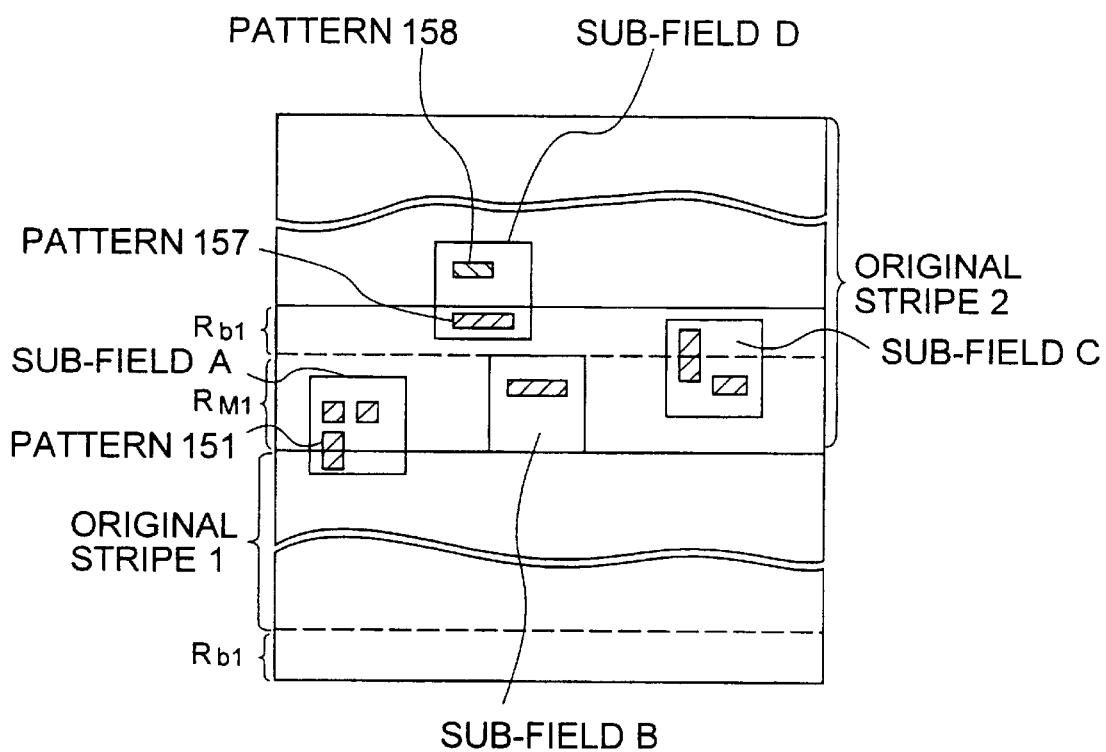
Figure 38:
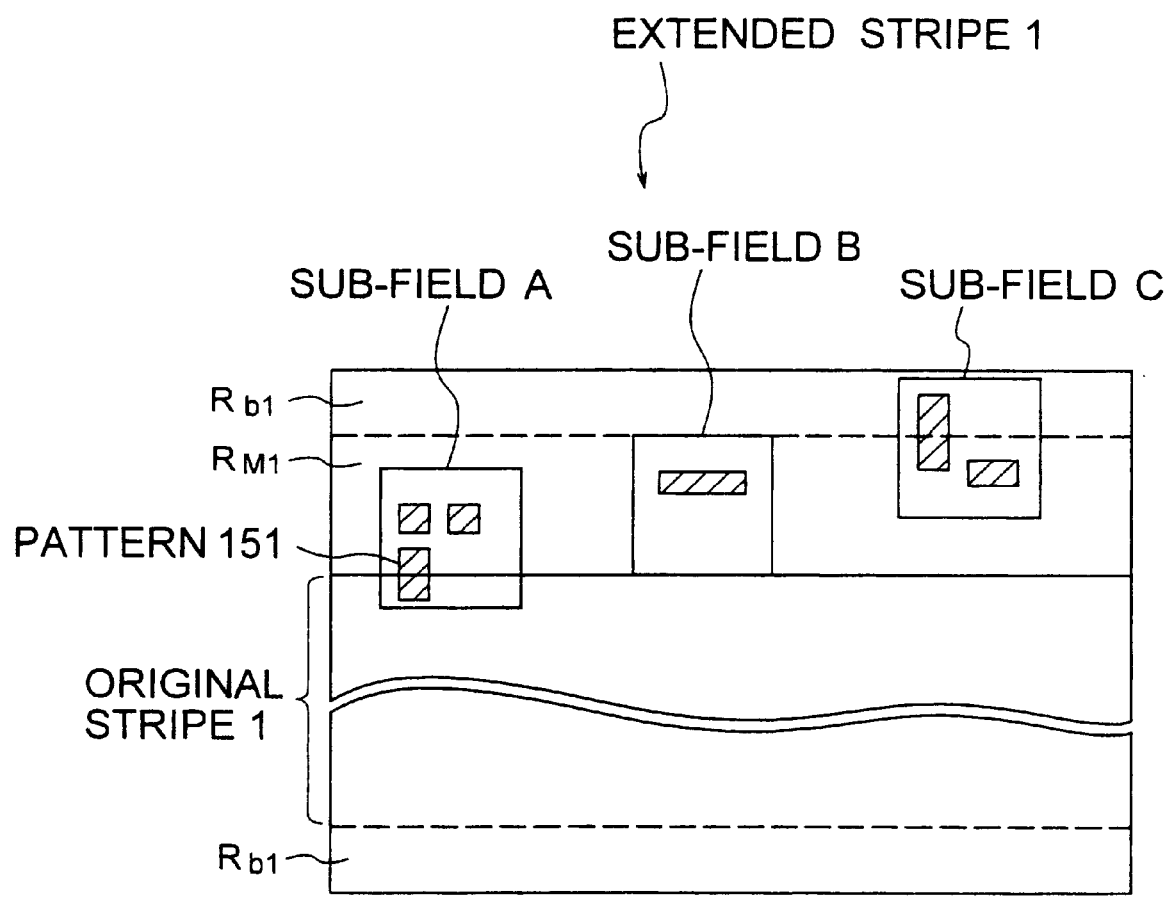
Figure 39:
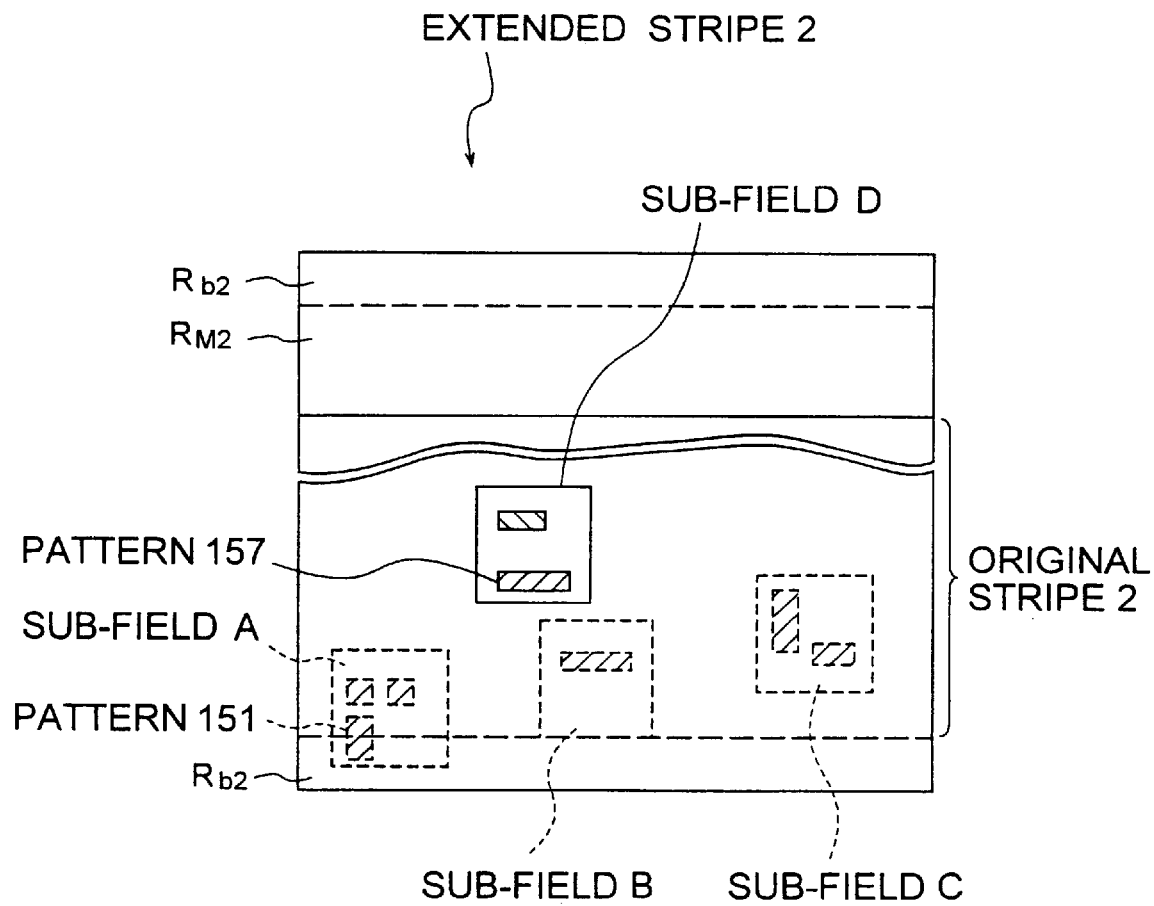
Figure 40A:
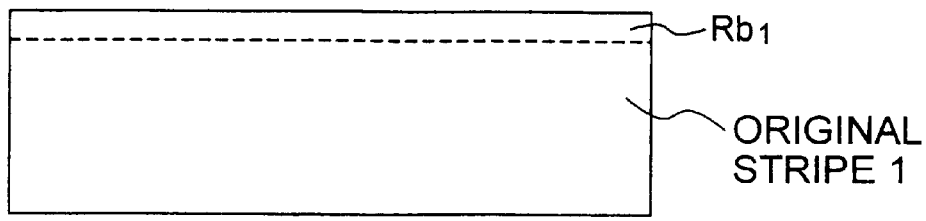
FIGS. 40A through 40D are imaginative diagrams showing pattern data stored in the buffer memory of the proximity effect circuit part shown in FIG. 34.
Figure 40B:
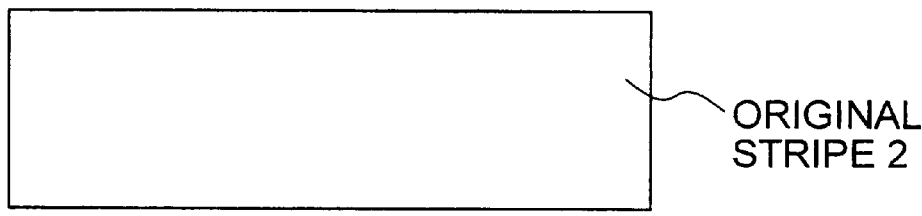
Figure 40C:
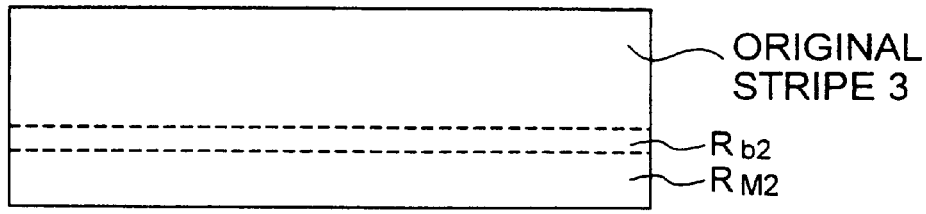
Figure 40D:
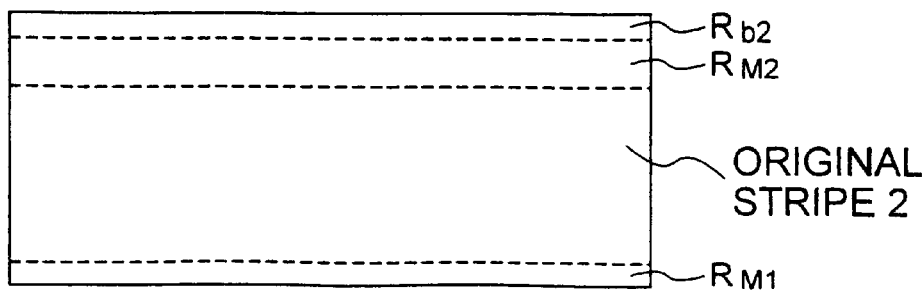

FIG. 37 shows an extended stripe applied to the pattern shown in FIG. 2. As shown in this figure the whole region of each of sub-fields A, B and C is contained in the original stripe 1, a margin region $R_{M1}$ and a backward scattering region $R_{b1}$. Therefore, as shown in FIG. 38, the sub-fields A through C belong to an extended stripe 1. On the other hand, although a pattern 157 serving as a part of a sub-field D is arranged in the back scatting region Rb1, a pattern 158 of the sub-field D is not contained in any one of the margin region $R_{M1}$ and the backward scattering region $R_{b1}$. Therefore, the sub-field D does not belong to the extended stripe 1, and belongs to an extended stripe 2 as shown in FIG. 39.

The pattern divided using such an extended stripe is processed by the proximity effect correcting circuit part 171. The dosage data corresponding to the pattern of an LSI are transferred from the control computer 37 to the buffer memories 181 through 184 every original stripe in accordance with the arrangement of original stripes. For example, as shown in FIG. 34, the control computer 37 causes data, which are obtained by adding the backward scattering region $R_{b1}$ to the original stripe 1, to be stored in the buffer memory 181, and the data for the original stripe 2 to be stored in the buffer memory 182. Moreover, data obtained by adding a margin region $R_{M2}$ and a backward scattering region $R_{b2}$ to the original stripe 3 are stored in the buffer memory 183. At the same time that the data for the original stripe 4 are transferred from the control computer 37 to the buffer memory 184, the region combining circuit 172 selects and extracts dosage data corresponding to the respective pattern from the buffer memories 181 through 183 to prepare an extended stripe 2. That is, the dosage data of the pattern in the backward scattering region $R_{b1}$, the dosage data of the pattern in the original stripe 2, the dosage data of the patterns in the margin region $R_{M2}$ and the backward scattering region $R_{b2}$ are taken out of the buffer memory 181, the buffer memory 182 and the buffer memory 183, respectively, to combine the dosage data of the patterns in these regions to prepare the extended stripe 2 to transfer the extended stripe 2 to the buffer memory 185. The dosage data of the pattern stored in each of the buffer memories 181 through 183 and 185 are imaginatively shown in FIGS. 40A through 40D.

Referring to FIG. 34 again, when the data for the extended stripe 2 are transferred from the region combining circuit 172 to the buffer memory 185 (or the buffer memory 186), the data for the extended stripe 1, which have been prepared to be stored, are transferred from the buffer memory 186 (or the buffer memory 185) to the proximity effect correcting circuit 173. The proximity effect correcting circuit 173 carries out the calculation for the proximity effect correction on the basis of the dosage data corresponding to the pattern of the inputted extended stripe 1 to output an optimum dosage. In this preferred embodiment, a method utilizing a simple formula of an approximate solution (e.g., a method described in Journal of Vacuum Science and Technology B4, 159 (1986) (J. M. Parkovich)) is used for this calculation. The proximity effect correcting circuit 173 outputs the calculated results to the dosage data memory 187 (or the dosage data memory 188) to store the calculated results therein.

Then, as shown in FIG. 35, the dosage data for each of the extended stripes are transferred from the proximity effect correcting circuit 171 to the dosage data memories 161 through 163 of the writing circuit 52 every mesh. Furthermore, the dosage mesh data in the backward scattering region $R_b$ are not used for the writing operation since these data include errors in the boundary portion. Therefore, the dosage mesh data for the original stripe and the margin region $R_M$ other than the backward scattering region $R_b$ are transferred to the writing circuit 52.

Figure 41A:
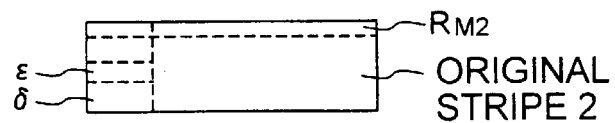
FIGS. 41A through 41E are imaginative diagrams for explaining the operation of an intermediate stripe dosage data preparing circuit of the writing circuit shown in FIG. 35.
Figure 41B:
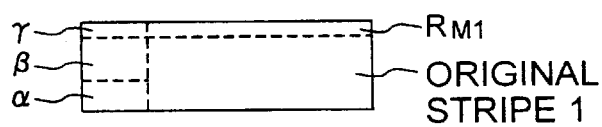
Figures 41C, 41D:
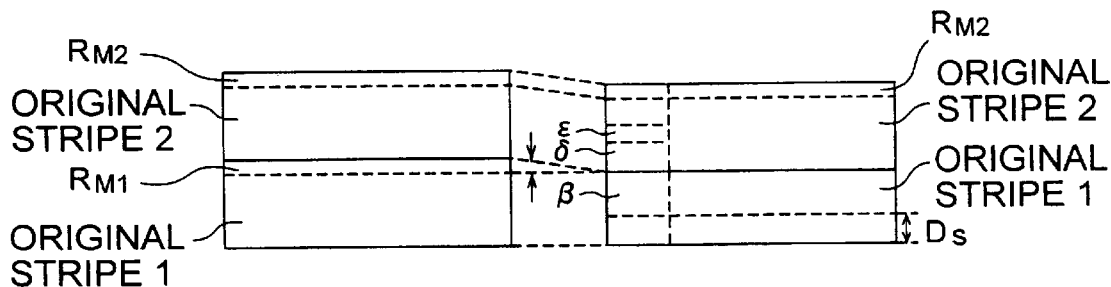
Figure 41E:
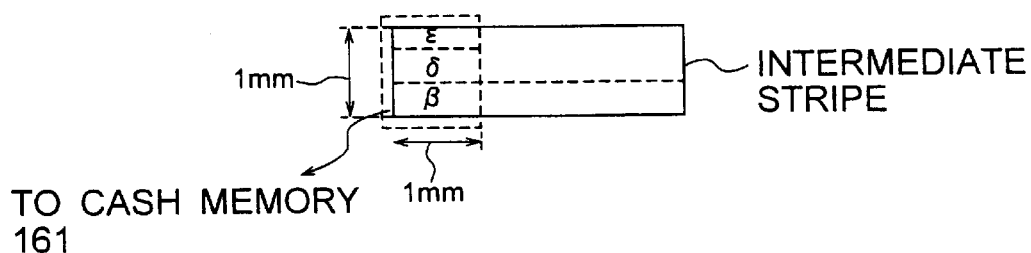

In this preferred embodiment, since the original stripe on data is written as it is when the first writing operation is carried out, the dosage data corresponding thereto are utilized. On the other hand, when an intermediate stripe is written, the intermediate stripe dosage data preparing circuit 174 prepares an intermediate stripe from the dosage mesh data stored in the dosage data memories 161 through 163. FIGS. 41A through 41E are imaginative diagrams showing data in each stage until the intermediate stripe dosage data preparing circuit 174 prepares the intermediate stripe. FIG. 41A shows, e.g., data for the original stripe 2 and the margin region $R_{M2}$ stored in the dosage data memory 162, and FIG. 41B schematically shows, e.g., data for the original stripe 1 and the margin region $R_{M1}$ stored in the dosage data memory 161. FIG. 41C is a imaginative diagram of the two original stripes simply arranged in the prior art, and FIG. 41D is a imaginative diagram of the two original stripes when the margin region $R_{Ml}$ is removed by the control method in this preferred embodiment. Moreover, FIG. 41E is a imaginative diagram of an intermediate stripe comprising a part of the region of the original stripe 1 and a part of the region of the original stripe 2. Furthermore, this intermediate stripe is one in case that the reference position for the setting of the stripe is shifted by a distance $D_S$ shown in FIG. 41D.

When the original stripe 1 itself is written, the dosage mesh data in the original stripe 1 including the margin region $R_{Ml}$ and the pattern data corresponding thereto are utilized to write the original stripe 1 as shown in FIG. 41B.

On the other hand, in this preferred embodiment, the margin region $R_{Ml}$ between the two original stripes serving as basic data is not used in order to prepare the dosage mesh data in the intermediate stripe. This is because the coordinates of the dosage mesh are shifted in the original stripe 2 and the margin region $R_{M2}$ if the two original stripes 1 and 2 are simply arranged to prepare the intermediate stripe as shown in FIG. 41C. That is, as can be clearly seen from the comparison of FIGS. 38 with FIG. 39, the dosage mesh in the margin region $R_{Ml}$ is originally the same as the dosage mesh in the lower region of the original stripe 2, so that the coordinates are shifted by the height thereof. This can also be seen from the comparison of FIG. 41C with FIG. 41D, i.e., from the fact that the original stripe 2 is shifted vertically by the height of the margin region $R_{Ml}$ in the prior art. The stripe image of FIG. 41D is formed by reading the region of the original stripe 1 from the dosage data memory 161 and reading the region of the original stripe 2 and the region of the margin region $R_{M2}$ from the dosage data memory 162. In fact, the intermediate stripe is not written after the dosage data for the whole intermediate stripe are prepared, and the intermediate stripe dosage data preparing circuit 174 prepares the dosage data for the intermediate stripe every region of 1 mm×1 mm. That is, the range of the coordinates of the dosage mesh is indicated to read, e.g., a region β shown in FIG. 41B, from the dosage data memory 161. Similarly, e.g., regions δ and ε shown in FIG. 41A, are read from the dosage data memory 162. Thus, as shown in FIG. 41E, a region (β+δ+ε) constituting a region of 1 mm×1 mm is transferred to the cash memory 164. While the above described read and transfer are processed, the writing operation in the prepared block is carried out by the parallel processing.

The data transfer to the cash memory 164 is carried out on the basis of the data concerning the procedure for utilizing the mesh data, which have been stored. Although the setting of the dosage data is carried out every shot, the dosage data stored in the cash memory 164 are utilized in this preferred embodiment as follows.

First, the position (k, l) of the dosage mesh corresponding to a certain shot is calculated by the following formula. The dosage possessed by the dosage mesh corresponds to the value of the shot.

(k)=(X-Coordinate of Center of Shot−X-Coordinate of Mesh Origin of Stripe to be written)/Mesh Size X (l)=(Y-Coordinate of Center of Shot−Y-Coordinate of Mesh Origin of Stripe to be written)/Mesh Size Y Thereafter, by the same procedure as steps S116 through S119 of FIG. 22, the dosage data of each shot are converted into data concerning the number of clocks for the irradiation time by means of the irradiation time calculating circuit 168 of the writing circuit 52 to be supplied to the blanking control circuit part 34, so that the blanking control circuit part 34 causes beams to be turned ON and OFF in accordance with the number of clocks to write patterns. The number of clocks is calculated in accordance with the above-described formula (7).

By the above described method, the dosage can be controlled every shot to execute corrections in dosage. By carrying out this operation every stripe to be written, both of the proximity effect correction and the multiple writing operation can be carried out.

While the present invention has been disclosed in terms of the preferred embodiment in order to facilitate better understanding thereof, it should be appreciated that the invention can be embodied in various ways without departing from the principle of the invention. For example, in the above embodiments an electron beam has been shown as a form of a charged beam, however, the present invention can apparently be applied for a charge beam lithography system using an ion beam. Therefore, the invention should be understood to include all possible embodiments and modification to the shown embodiments which can be embodied without departing from the principle of the invention as set forth in the appended claims.

What is claimed is:

1. A charged beam lithography system comprising:
    a charged particle optics system for causing a surface of a substrate to be irradiated with a charged beam to a pattern to be written, on the basis of writing data, which are obtained by processing data of said pattern by a predetermined conversion;
    a proximity effect correction calculating circuit for calculating a corrected dosage by correcting a dosage of said charged beam corresponding to said pattern in view of the influence of the proximity effect wherein charge beam exposures to adjacent patterns are increased by backward scattered electrons produced on the surface of said substrate by the irradiation with said charged beam;
    a data converter for converting said pattern data into intermediate data to be converted into said writing data;
    an intermediate data combining circuit for combining said intermediate data, which have been converted from data of said pattern in adjacent first regions, to prepare combined intermediate data corresponding to a pattern in a second region greater than said first regions; and
    a controller for supplying said combined intermediate data to said proximity effect correction calculating circuit to cause said proximity effect correction calculating means to calculate a correction in said second region to supply the calculated result to said charged beam lithography system to cause said charged beam lithography system to carry out a continuous write operation on said second region.

2. A charged beam lithography system as set forth in claim 1, wherein said controller compares a distance between patterns in said adjacent first regions with a predetermined reference value, and causes said intermediate data combining circuit to combine said intermediate data when said distance is smaller than said predetermined reference value.

3. A charged beam lithography system as set forth in claim 1, wherein said controller calculates a writing time on the basis of said pattern data, and causes said intermediate data combining circuit to combine said intermediate data when it is determined that said writing time can be shorten by combining said intermediate data.

4. A charged beam lithography system comprising:
    a charged particle optics system having a charged particle gun for generating charged beams, a main deflecting system and a sub-deflecting system for deflecting said charged beam shot by said charged particle gun, and a stage for mounting a substrate thereon, said charged particle optics system causing the surface of said substrate to be irradiated with said charged beams from said charged particle gun while continuously moving said stage, to write a desired pattern for each of stripes defined by the maximum deflection widths of said main deflecting system and said sub-deflecting system;
    a proximity effect correcting circuit for calculating an optimum dosage for each of said stripes by correcting the dosage of said charged beam in view of the influence of the proximity effect;
    a storage device for storing data of said optimum dosage for at least two of said stripes; and
    a controller for selectively taking said optimum dosage data out of said storage device so as to correspond to each of stripe to be written at each number of writing while shifting a divided form of the whole region to be written using said stripes at each number of writing, by a predetermined distance from a predetermined reference position in a direction perpendicular to a stage continuous moving direction, to supply the taken-out data to said charged particle optics system to cause said charged particle optics system to multiple-write the same pattern on the surface of said substrate by a plurality of times.

5. A charged beam lithography system as set forth in claim 4, wherein said proximity effect correction calculating circuit calculates an optimum dosage for each of small regions formed by equally dividing the region of said stripe in the form of a lattice;
    said storage device stores therein said optimum dosage data, together with a reference position data indicative of a reference position of a set of said small regions every said stripe; and
    said controller selectively takes said optimum dosage data out of said storage device for each of said stripes at each number of writing on the basis of said reference position data to supply the taken-out optimum dosage data to said charged particle optics system.

6. A charged beam lithography system as set forth in claim 5, wherein said controller takes out said optimum dosage data for the next region to be written, while said charged particle optics system carries out the writing operation.

7. An electron beam lithography system as set forth in claim 6, wherein said proximity effect correction calculating circuit calculates said optimum dosage for said stripes corresponding to regions to be written after next and thereafter, while said charged particle optics system carries out the writing operation, to prepare the next optimum dosage data to be taken out by said controller.

8. A charged beam lithography system comprising:
    a charged particle optics system having a charged particle gun for generating charged beams, a main deflecting system and a sub-deflecting system for deflecting said charged beams generated by said charged particle gun, and a stage for mounting a substrate thereon, said charged particle optics system causing the surface of said substrate to be irradiated with said charged beams from said charged particle gun while continuously moving said stage, to write a desired pattern for each of first stripes defined by the maximum deflection widths of said main deflecting system and said sub-deflecting system;
    a data converter for dividing said pattern data every second stripe, which is formed by extending the region of said first stripe in a direction perpendicular to a stage continuous moving direction, to prepare calculating data;
    a corrected dosage calculating circuit for receiving said calculating data from said data converting means to correct the dosage of said charged beams in view of the influence of the proximity effect to calculate an optimum dosage; and a controller for removing an overlap portion from said optimum dosage of said second stripes adjacent to each other in a direction perpendicular to a continuous moving direction of said stage on the basis of said optimum dosage data to prepare writing data corresponding to a pattern contained in said first stripe to supply the prepared writing data to said charged particle optical system to cause said charged particle optical system to write said pattern, and for shifting a reference position for setting said first stripe at each writing number of times, by a predetermined distance in a direction perpendicular to the continuous moving direction of said stage to prepare multiple writing data to supply said multiple writing data to said charged particle optics system to cause said charged particle optical system to multiple-write the same pattern on the surface of said substrate by a plurality of times.

9. A charged beam lithography system as set forth in claim 8, wherein said controller prepares said writing data for said first stripe with respect to the next region to be written, while said charged particle optical system carries out the writing operation.

10. A charged beam lithography system as set forth in claim 9, wherein said proximity effect correction calculating circuit calculates said optimum dosage for said second stripes corresponding to regions to be written after next and thereafter, while said charged particle optical system carries out the writing operation.

11. A charged beam lithography system as set forth in claim 10, wherein said second stripe includes one of said first stripes, an auxiliary region of a predetermined size added to said first stripe, and backward scattering regions which are added to said auxiliary region and said first stripe outside thereof in the vertical directions of said stage continuous moving direction and which is provided for compensating the influence of the proximity effect caused by a pattern in another first stripe.

12. A charged beam lithography system as set forth in claim 11, wherein said pattern divided by the boundary between adjacent two of said first stripes is defined so as to belong to said second stripe when the whole region of a sub-field containing the divided pattern is contained in said auxiliary region.

* * * * *